(12) United States Patent
Wakita et al.

(10) Patent No.: US 8,541,693 B2
(45) Date of Patent: Sep. 24, 2013

(54) WIRING BOARD AND METHOD FOR MANUFACTURING THE SAME

(75) Inventors: Hideyuki Wakita, Ogaki (JP); Akihide Kawaguchi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 285 days.

(21) Appl. No.: 13/012,873

(22) Filed: Jan. 25, 2011

(65) Prior Publication Data

US 2011/0240356 A1    Oct. 6, 2011

Related U.S. Application Data

(60) Provisional application No. 61/319,568, filed on Mar. 31, 2010.

(51) Int. Cl.
*H05K 1/11* (2006.01)
*H01K 3/10* (2006.01)

(52) U.S. Cl.
USPC ............................................ 174/262; 29/852

(58) Field of Classification Search
USPC .... 174/262–266; 361/792–795; 29/852–853
See application file for complete search history.

(56) References Cited

FOREIGN PATENT DOCUMENTS

| JP | 2001-210952 | 8/2001 |
|---|---|---|
| JP | 2002-252446 | 9/2002 |
| JP | 2005-311252 | 11/2005 |
| JP | 2007-214568 | 8/2007 |
| JP | 2007-305617 | 11/2007 |
| JP | 2008-251638 | 10/2008 |
| JP | 2009-99649 | 5/2009 |
| JP | 2009-194381 | 8/2009 |
| JP | 2009-302506 | 12/2009 |
| JP | 2011-066223 | 3/2011 |
| TW | 201010550 | 3/2010 |
| WO | 2007/007857 | 1/2007 |

OTHER PUBLICATIONS

U.S. Appl. No. 13/012,267, filed Jan. 24, 2011, Wakita, et al.

*Primary Examiner* — Jeremy Norris
(74) *Attorney, Agent, or Firm* — Oblon, Spivak, McClelland, Maier & Neustadt, L.L.P.

(57) ABSTRACT

A wiring board includes a core substrate, a first laminated structure formed on a surface of the substrate and including conductive and insulation layers, and a second laminated structure formed on the opposite surface of the substrate and including conductive and insulation layers. The substrate has a connection conductor made of a plating. The insulation layers of the first laminated structure have connection conductors stacked one over another and made of platings. The insulation layers of the second laminated structure have connection conductors stacked one over another and made of platings. The connection conductors of the laminated structures are stacked on the connection conductor of the substrate. The connection conductors of the laminated structures include outer-layer connection conductors which have positions shifted in a substantially same direction from the position of the connection conductor of the substrate.

22 Claims, 31 Drawing Sheets

FIG.9

|  | Percentage of Cracks (%) | |
| --- | --- | --- |
|  | Eight-layer Sample | 10-layer Sample |
| Fourth Layer |  | 0 |
| Third Layer | 0 | 0 |
| Second Layer | 0 | 0 |
| First Layer | 7.5 | 8.4 |
| Core | 92.5 | 91.6 |

WIRING BOARD AND METHOD FOR MANUFACTURING THE SAME

CROSS-REFERENCE TO RELATED APPLICATIONS

The present application claims the benefits of priority to U.S. Application No. 61/319,568, filed Mar. 31, 2010. The contents of that application are incorporated herein by reference in their entirety.

BACKGROUND OF THE INVENTION

1. Field of the Invention

The present invention relates to a wiring board in which two or more conductive layers and two or more insulation layers are alternately laminated on both sides of a core substrate, and to a method for manufacturing such a wiring board.

2. Discussion of the Background

Japanese Laid-Open Patent Publication No. 2001-210952 describes a wiring board, which has a through-hole conductor formed by filling plating in a through hole and a via conductor formed by filling plating in a via hole. Such a through-hole conductor and via conductor are stacked vertically one over another (in a direction Z).

The contents of Japanese Laid-Open Patent Application No. 2001-210952 are incorporated herein by reference in their entirety in the present application.

SUMMARY OF THE INVENTION

According to one aspect of the present invention, a wiring board includes a core substrate having a first surface and a second surface on the opposite side of the first surface, a first laminated structure formed on the first surface of the core substrate and including multiple conductive layers and multiple insulation layers, and a second laminated structure formed on the second surface of the core substrate and including multiple conductive layers and multiple insulation layers. The core substrate has a hole and a connection conductor including a plating filling the hole. The insulation layers of the first laminated structure has multiple holes and multiple connection conductors. The connection conductors of the first laminated structure are stacked one over another and include platings filling the holes in the first laminated structure, respectively. The insulation layers of the second laminated structure has multiple holes and multiple connection conductors. The connection conductors of the second laminated structure are stacked one over another and include platings filling the holes in the second laminated structure, respectively. The connection conductors of the first and second laminated structures are stacked on the connection conductor of the core substrate. The connection conductors of the first laminated structure include an outer-layer connection conductor formed in an outer insulation layer of the insulation layers of the first laminated structure. The connection conductors of the second laminated structure include an outer-layer connection conductor formed in an outer insulation layer of the insulation layers of the second laminated structure. The outer-layer connection conductors of the first and second laminated structures have positions which are shifted in a substantially same direction from a position of the connection conductor of the core substrate.

According to another aspect of the present invention, a method for manufacturing a wiring board includes preparing a core substrate having a hole and a connection conductor including a plating filling the hole, forming insulation layers on a first surface of the core substrate and a second surface of the core substrate, respectively, forming holes in the insulation layers, respectively, filling platings in the holes in the insulation layers such that connection conductors are formed, and forming conductive layers on the insulation layers, respectively. The forming of the insulation layers, the filling of the platings and the forming of the conductive layers are carried out in repetition such that a first laminated structure including multiple conductive layers, insulation layers and connection conductors is formed on the first surface of the core substrate, that a second laminated structure including multiple conductive layers, insulation layers and connection conductors is formed on the second surface of the core substrate, that the connection conductors of the first and second laminated structures are stacked on the connection conductor of the core substrate, that the connection conductors of the first laminated structure include an outer-layer connection conductor formed in an outer insulation layer of the insulation layers of the first laminated structure, that the connection conductors of the second laminated structure include an outer-layer connection conductor formed in an outer insulation layer of the insulation layers of the second laminated structure, and that the outer-layer connection conductors of the first and second laminated structures have positions which are shifted in a substantially same direction from a position of the connection conductor of the core substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a graph showing the simulation results regarding the percentage of cracks occurring in each layer of an eight-layer sample and a 10-layer sample;

DETAILED DESCRIPTION OF THE EMBODIMENTS

Figure 1:
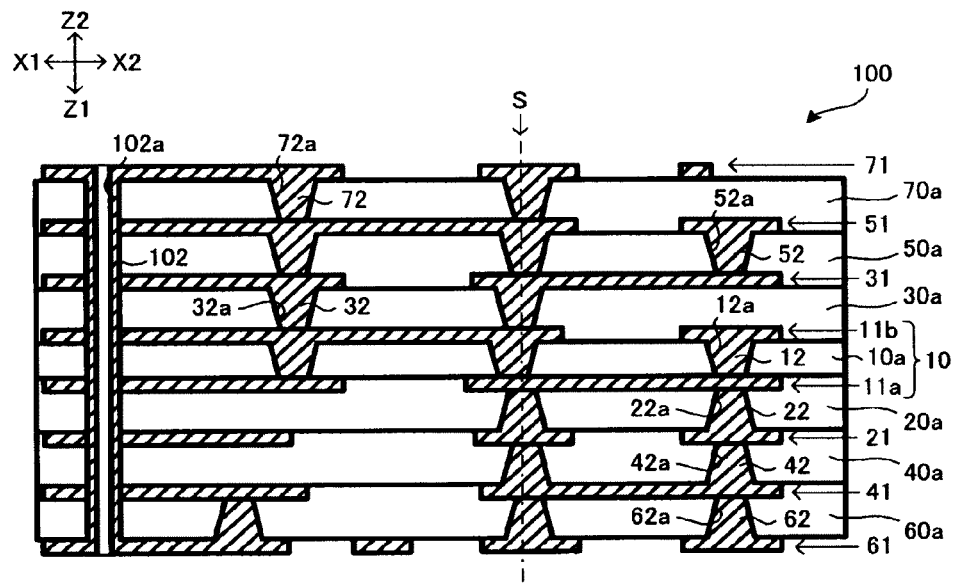
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Also, side surfaces of a wiring board are on the X-Z plane or the Y-Z plane.

Regarding a filled conductor and its hole, a cross section perpendicular to directions Z (X-Y plane) is referred to as a horizontal cross section. Also, a cross section parallel to directions Z (X-Z plane or Y-Z plane) is referred to as a vertical cross section.

Regarding a filled conductor, a line parallel to directions Z and passing through the center of its horizontal cross section (if it is not a circle, the gravity center of each horizontal cross section) is referred to as an axis. Namely, the axis direction substantially corresponds to directions Z.

In the present embodiment, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or the inner-layer side), and the side farther from the core is referred to as an upper layer (or the outer-layer side). In addition, an outermost layer is referred to as an outer layer, and layers lower than the outer layer are referred to as inner layers.

Aside from a layer that includes a conductive pattern which functions as wiring such as circuits (including ground), a layer with only a plain pattern is also referred to as a conductive layer. The conductor formed in a hole penetrating through an insulation layer is referred to as a connection conductor.

Holes include a via hole and a through hole. A via hole indicates a hole, for example, which is formed by boring a hole in an insulation layer having a conductive layer on its one side (primarily a lower-side conductive layer), and which reaches that conductive layer from the other side of the insulation layer. Since a conductor in a via hole (hereinafter referred to as a via conductor) is formed when a conductive layer is formed on one side of the insulation layer, the via conductor and a conductive layer at least on one side of the insulation layer are not be contiguous, and an interface is formed between them. On the other hand, a through hole indicates a hole which is formed to penetrate through an insulation layer including a conductive layer when a conductive layer is formed on one side or on both sides of the insulation layer. Since a conductor formed in a through hole (hereinafter referred to as a through-hole conductor) is usually formed by plating or the like at the same time the conductive layers on both sides of an insulation layer are formed, the through-hole conductor and the conductive layers on both sides of the insulation layer are at least partially contiguous.

Among conductors formed in a hole or in a notch (a via conductor, a through-hole conductor and the like), conductive film formed on the wall surfaces of a hole or a notch is referred to as a conformal conductor, and a conductor filled in a hole or a notch is referred to as a filled conductor. Conductive layers may include the land of a filled conductor along with the above conductive patterns.

Plating indicates depositing conductors (such as metal) to form layers on metal or resin surfaces as well as such deposited conductive layers (such as metal layers). Other than wet plating such as electrolytic plating and electroless plating, plating also includes dry plating such as PVD (Physical Vapor Deposition) and CVD (Chemical Vapor Deposition).

Unless specifically indicated, the "width" of a hole or a cylinder (protruding portion) indicates the diameter if it is a circle, and $2\sqrt{(\text{cross sectional area}/\pi)}$ if it is other than a circle.

If a hole or a cylinder (protruding portion) tapers, whether "widths" in two or more holes or protruding portions are the same or not the same may be determined by comparing the values, average values, maximum values or the like of corresponding portions.

Figure 2:
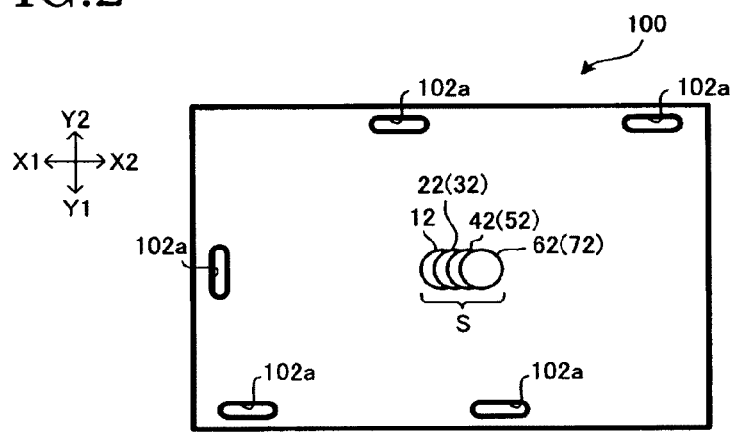
FIG. 2 is a plan view of the wiring board according to an embodiment of the present invention.

Wiring board 100 of the present embodiment is a printed wiring board. As shown in FIGS. 1 and 2, wiring board 100 has core substrate 10, insulation layers (20a, 30a, 40a, 50a, 60a, 70a), conductive layers (21, 31, 41, 51, 61, 71) and filled conductors (22, 32, 42, 52, 62, 72). Namely, on a first-surface side of core substrate 10, three insulation layers (20a, 40a, 60a) and three conductive layers (21, 41, 61) are alternately laminated. In addition, on a second-surface side of core substrate 10, three insulation layers (30a, 50a, 70a) and three conductive layers (31, 51, 71) are alternately laminated. Here, core substrate 10 corresponds to the core section. Also, insulation layers (20a~70a) etc. positioned as upper layers on the core section correspond to buildup sections.

Core substrate 10 has insulation layer (10a), conductive layers (11a, 11b) and filled conductors 12. Via holes (12a) are formed in insulation layer (10a) and penetrate through insulation layer (10a). Filled conductors 12 are formed by filling plating in via holes (12a). Filled conductors 12 corresponds to connection conductors. In the present embodiment, filled conductors 12 are via conductors. Since via conductors are easier to form than through-hole conductors, such a structure is advantageous in terms of cost reduction. However, filled conductors 12 are not limited to the above and may also be through-hole conductors (see later-described FIG. 32).

Insulation layer (10a) is made of epoxy resin, for example. Epoxy resin is preferred to contain a reinforcing material such as glass fiber (glass fabric or glass non-woven fabric, for example) or aramid fiber (aramid non-woven fabric, for example) impregnated with resin, for example. The reinforcing material has a smaller thermal expansion coefficient than the primary material (epoxy resin in the present embodiment). However, the material for insulation layer (10a) is not limited to such, and any other material may be used.

Conductive layers (11a, 11b) are made of copper foil and copper plating, for example. Also, filled conductors 12 are made of copper plating, for example. Filled conductors 12 are formed to be, for example, a tapered cylinder (a truncated cone) whose diameter increases from the first-surface side toward the second-surface side. A horizontal cross section (on the X-Y plane) of filled conductors 12 is a perfect circle, for example. However, filled conductors 12 are not limited to such, and may be formed in any other shape (see later-described FIGS. 27A~29B).

In the present embodiment, conductive layers (11a, 11b) have a triple-layer structure of copper foil, electroless plated film and electrolytic plated film (see later-described FIG. 31A). However, the structure of conductive layers (11a, 11b) is not limited specifically (see later-described FIGS. 31B, 31C).

Insulation layer (20a) is laminated on the first-surface side of core substrate 10 and insulation layer (30a) is laminated on the second-surface side of core substrate 10. Then, conductive layer 21 is formed on the first surface of insulation layer (20a), and conductive layer 31 is formed on the second surface of insulation layer (30a). Also, insulation layer (40a) is laminated on the first-surface side of insulation layer (20a) and insulation layer (50a) is laminated on the second-surface side of insulation layer (30a). Then, conductive layer 41 is formed on the first surface of insulation layer (40a), and conductive layer 51 is formed on the second surface of insulation layer (50a). Moreover, insulation layer (60a) is laminated on the first-surface side of insulation layer (40a) and insulation layer (70a) is laminated on the second-surface side of insulation layer (50a). Then, conductive layer 61 is formed on the first surface of insulation layer (60a), and conductive layer 71 is formed on the second surface of insulation layer (70a).

Conductive layers (21, 31, 41, 51, 61, 71) are made of, for example, copper foil and copper plating.

In the present embodiment, conductive layers (21, 31, 41, 51, 61, 71) have a triple-layer structure of metal foil, electroless plated film and electrolytic plated film (see later-described FIG. 31A). However, the structure of conductive layers (21, 31, 41, 51, 61, 71) is not limited to such, and any other structure may also be employed (see later-described FIGS. 31B and 31C).

Insulation layers (20a, 30a, 40a, 50a, 60a, 70a) correspond to interlayer insulation layers. Insulation layers (20a, 30a, 40a, 50a, 60a, 70a) are each made by impregnating a core material with resin. Inorganic material such as glass fiber and aramid fiber may be used as a core material. As for resins, for example, the following may be used: epoxy resin, polyester resin, bismaleimide triazine resin (BT resin), imide resin (polyimide), phenol resin or allyl polyphenylene ether resin (A-PPE resin) or the like.

Insulation layers (20a, 30a, 40a, 50a, 60a, 70a) have filled conductors (22, 32, 42, 52, 62, 72) (all are via conductors) formed by filling plating in their respective via holes (22a, 32a, 42a, 52a, 62a, 72a). Each one of filled conductors (22, 32, 42, 52, 62, 72) corresponds to a connection conductor. Filled conductors (22, 32, 42, 52, 62, 72) are made of copper plating, for example. Filled conductors (22, 42, 62) are formed to be, for example, a tapered cylinder (a truncated cone) whose diameter increases from the second-surface side toward the first-surface side. Horizontal cross sections (on the X-Y plane) of filled conductors (22, 42, 62) are shaped to be a perfect circle, for example. Filled conductors (32, 52, 72) are formed to be, for example, a tapered cylinder (a truncated cone) whose diameter increases from the first-surface side toward the second-surface side. Horizontal cross sections (on the X-Y plane) of filled conductors (32, 52, 72) are shaped to be a perfect circle, for example. However, the shape of filled conductor 22 and the like is not limited to the above, and any other shape may also be employed (see later-described FIGS. 27A~29B).

In wiring board 100, filled conductor 12 in the core section (core substrate 10) and filled conductors (22, 32, 42, 52, 62, 72) in the buildup sections are stacked on both sides of core substrate 10 (first-surface side and second-surface side) by being shifted in substantially the same direction (for example, toward X2) from core substrate 10 toward upper layers. Accordingly, filled-stack structure "S" is extended in directions Z. Adjacent filled conductors are adhered to (in contact with) each other and electrically continuous with each other. Filled-stack structure "S" electrically connects conductive layers on both surfaces of wiring board 100, namely, conductive layer 61 on the first surface and conductive layer 71 on the second surface.

Filled-stack structure "S" has a structure in which filled conductors in all layers are stacked, a so-called full stack structure. Accordingly, wiring space is easily ensured, and design flexibility of wiring patterns is enhanced. In addition, since wiring in a direction X or a direction Y may be omitted, wiring length in interlayer connections may be reduced.

The positions and the number of filled-stack structures "S" may be determined freely. For example, a wiring board may have multiple filled-stack structures "S" (see later-described FIGS. 37A and 37B).

Figure 3A:
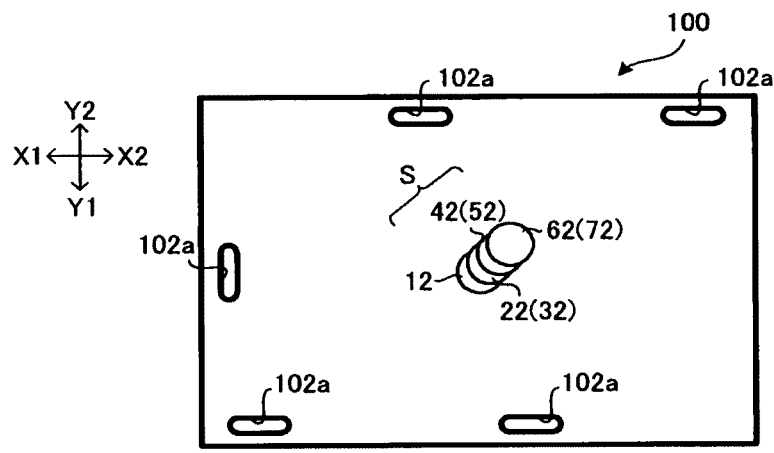
FIG. 3A is a view showing an example in which filled conductors of a filled-stack structure are shifted in a diagonal direction (an XY direction)
Figure 3B:
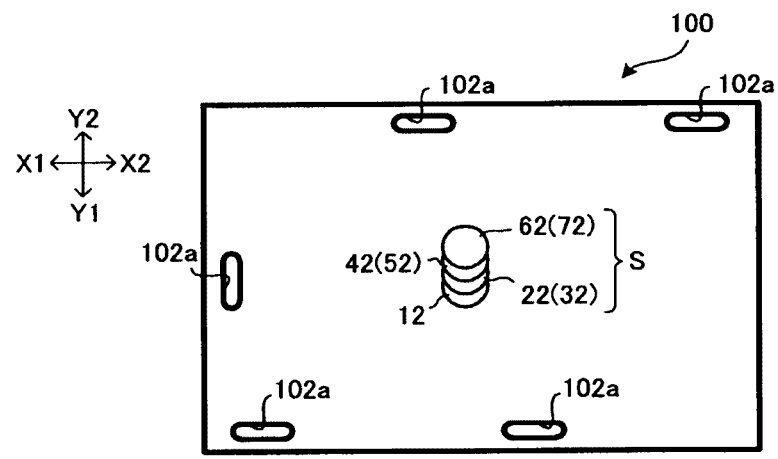
FIG. 3B is a view showing an example in which filled conductors of a filled-stack structure are shifted in a direction Y.

As shown in FIG. 2, filled conductors in filled-stack structure "S" are shifted in a direction X in the present embodiment. However, the shifting direction is not limited specifically. For example, the shifting direction may be diagonal (in an XY direction) as shown in FIG. 3A, or it may be in a direction Y as shown in FIG. 3B.

In the present embodiment, the shifting direction on one side of core substrate 10 (first-surface side) and the shifting direction on the other side of core substrate 10 (second-surface side) are both in a direction X (in particular, toward X2) and substantially the same as each other. However, they are not limited to such. For example, the shifting direction on the first-surface side may be in a direction X, while the shifting direction on the second-surface side is in an XY direction or a direction Y. In addition, it is not always required that each filled conductor in filled-stack structure "S" be positioned along a straight line on the X-Y plane. For example, their positions may be staggered (see later-described FIGS. 22A and 22B).

Through holes (102a) are formed to penetrate through all the layers in wiring board 100, and conformal conductors 102 (through-hole conductors) made of plating, for example, are formed on the wall surfaces of through holes (102a). Namely, through holes (102a) penetrate through wiring board 100 in directions Z (lamination directions).

In the present embodiment, conformal conductors 102 electrically connect conductive layer 61 and conductive layer 71. However, it is not always required for conformal conductors 102 to electrically connect conductive layers on both surfaces of wiring board 100 (conductive layers 61, 71). For example, conformal conductors 102 may be electrically connected to ground lines or the like in wiring board 100, or they may be electrically insulated from all the other conductors.

In the present embodiment, conformal conductors 102 are formed to be a double-layer structure of electroless plated film and electrolytic plated film, for example. However, the structure of conformal conductors 102 is not limited to such. For example, conformal conductors 102 may be formed only with electroless plated film or electrolytic plated film.

Unlike filled conductors formed by filling conductor in through holes (102a), conformal conductors 102 have conductor only on the wall surfaces of through holes (102a). Thus, space is formed in through holes (102a) and warping in wiring board 100 tends to be mitigated. However, the present embodiment is not limited to such and filled conductors may be used instead of conformal conductors 102.

Through holes (102a) are formed to be a cylinder, for example. The opening shape of through holes (102a) is an ellipse, for example. By setting the opening shape of through holes (102a) as an ellipse, it is thought that strength in a wider region on the X-Y plane is effectively enhanced.

Through holes (102a) are positioned on the periphery of wiring board 100, for example. However, the number, opening shape, positioning or the like of through holes (102a) may be determined freely (see later-described FIGS. 27A~27C, FIG. 30A and FIG. 30B).

Figure 4:
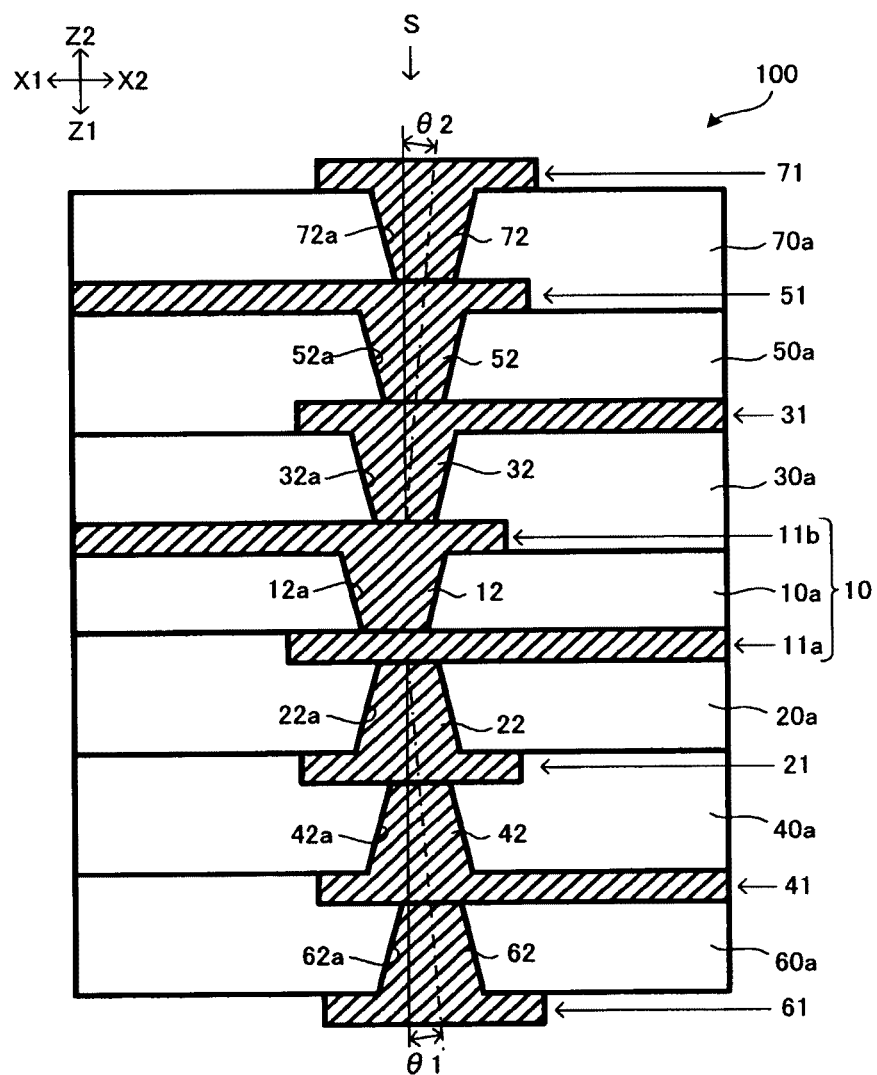
FIG. 4 is a magnified view of a filled-stack structure.

FIG. 4 is a magnified view of filled-stack structure "S." In the present embodiment, filled-stack structure "S" is formed in a V-shape with filled conductor 12 in core substrate 10 as the inflection point as shown in FIG. 4. The shifting angles in filled-stack structure "S" (inclination from a direction Z) are angle (θ1), which is substantially constant from the core toward the outermost layer on the first-surface side, and angle (θ2), which is substantially constant from the core toward the outermost layer on the second-surface side. The shifting angle (angle θ1) on one side (the first-surface side) of core substrate 10 and the shifting angle (angle θ2) on the other side (the second-surface side) of core substrate 10 are substantially the same as each other. Angles ($\theta 1$, $\theta 2$) are approximately 10 degrees, for example. However, shifting angles may be set freely. In addition, it is not always required that shifting angles be substantially constant (see later-described FIG. 16).

Figure 5A:
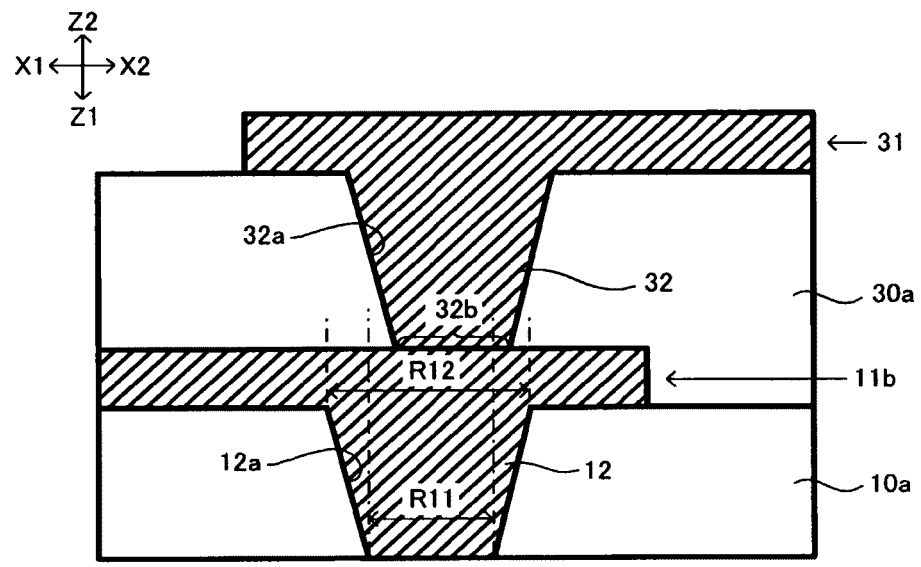
FIG. 5A is a magnified view showing part of FIG. 4, in particular, showing a filled conductor in a core substrate and a filled conductor stacked on its second surface.
Figure 5B:
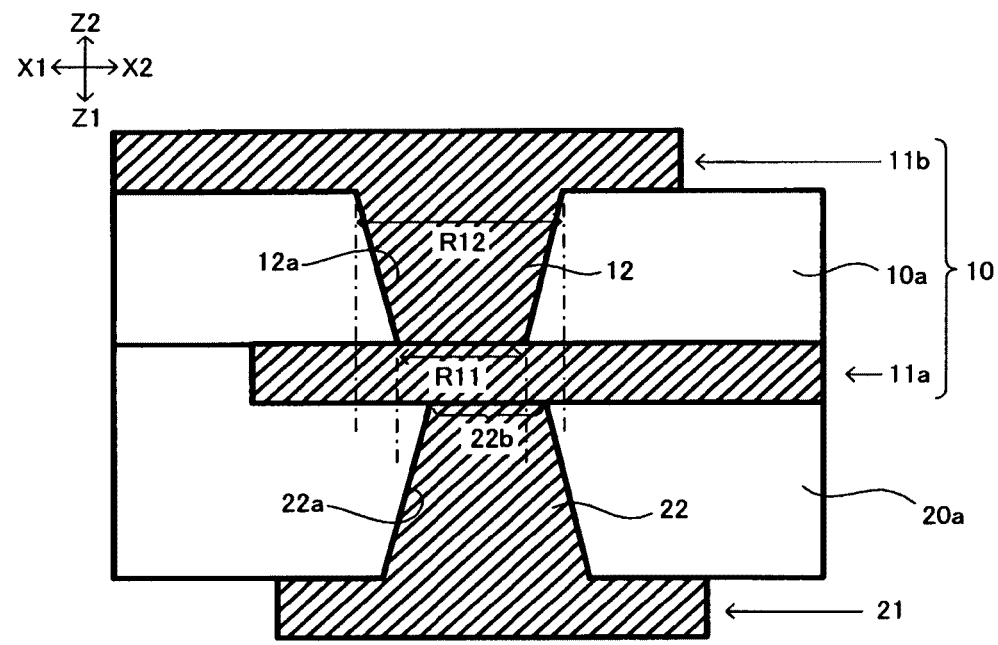
FIG. 5B is a magnified view showing part of FIG. 4, in particular, showing a filled conductor in a core substrate and a filled conductor stacked on its first surface.

FIGS. 5A and 5B are magnified views showing part of FIG. 4. In FIGS. 5A and 5B, range (R11) is an opening range of via hole (12*a*) on its first-surface side, and range (R12) is an opening range of via hole (12*a*) on its second-surface side.

In the present embodiment, when filled conductors having the same tapering direction are stacked, for example, when filled conductor 32 is stacked on the second-surface side of filled conductor 12, one edge (the inner edge) of lower-layer side end surface (32*b*) (the first-surface side) of filled conductor 32 may be positioned within range (R11), while the other edge (the outer edge) is positioned outside range (R11) but within range (R12) as shown in FIG. 5A. The same positional relationships are applied to the following: when filled conductor 52 is stacked on the second-surface side of filled conductor 32; when filled conductor 72 is stacked on the second-surface side of filled conductor 52; when filled conductor 22 is stacked on the first-surface side of filled conductor 12; when filled conductor 42 is stacked on the first-surface side of filled conductor 22; and when filled conductor 62 is stacked on the first-surface side of filled conductor 42.

Also, when filled conductors having opposite tapering directions are stacked, for example, when filled conductor 22 is stacked on the first-surface side of filled conductor 12, one edge (the inner edge) of lower-layer side end surface (22*b*) (the second-surface side) of filled conductor 22 may be positioned within range (R11), while the other edge (the outer edge) is positioned outside range (R11) but within range (R12) as shown in FIG. 5B.

However, positional relationships are not limited to the above. It is sufficient at least as long as each filled conductor is stacked. Here, "stacked" indicates that at least one edge (the inner edge) of the lower-layer side end surface of a filled conductor is positioned within an opening range of at least one side of a hole formed in the lower layer (see later-described FIGS. 17–20).

Figure 6:
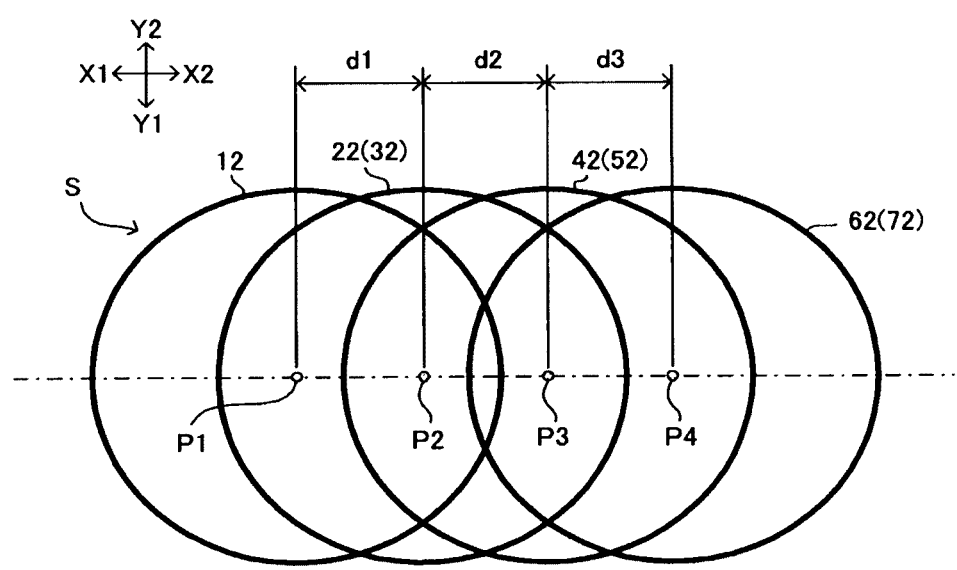
FIG. 6 is a view showing shifting amounts of filled conductors in a filled-stack structure.

As shown in FIG. 6, the shifting amounts in filled-stack structure "S" (in particular, the shifting amounts toward a direction X) are substantially constant from the core toward the first-surface side outermost layer. The shifting amounts on one side (first-surface side) of core substrate 10 and the shifting amounts on the other side (second-surface side) of core substrate 10 are substantially the same as each other. FIG. 6 shows the following: the distance between axis (P1) of filled conductor 12 and axis (P2) of filled conductor 22 or 32 in a direction X is set as shifting amount (d1); the distance between axis (P2) of filled conductor 22 or 32 and axis (P3) of filled conductor 42 or 52 in a direction X is set as shifting amount (d2); and the distance between axis (P3) of filled conductor 42 or 52 and axis (P4) of filled conductor 62 or 72 in a direction X is set as shifting amount (d3). Shifting amounts (d1, d2, d3) are each preferred to be set in an approximate range of 1~30 μm, more preferably an approximate range of 1~25 μm. However, their shifting amounts are not limited to the above and they may be in any other range. In addition, shifting amounts are not required to be substantially constant (see later-described FIG. 21).

As described above, in wiring board 100 of the present embodiment, filled conductors (12, 22, 32, 42, 52, 62, 72) are stacked on both sides of core substrate 10 to shift in substantially a constant direction (for example, toward X2) from core substrate 10 toward their respective upper-layer sides. Hereinafter, such a structure is referred to as a shifted-stack structure.

In a shifted-stack structure, hard filled conductors (12, 22, 32, 42, 52, 62, 72) fan out in directions X or directions Y, and there are fewer regions where hard conductors do not exist at all. Accordingly, there are fewer regions of lowered strength on the X-Y plane in wiring board 100. Therefore, it is thought that the wiring board would be more resistant to stress exerted instantaneously from outside such as the impact from being dropped or the like or to thermal stress repeatedly exerted from heat cycles.

In addition, in a shifted-stack structure, each filled conductor that forms filled-stack structure "S" is stacked with filled conductor 12 in core substrate 10 as the inflection point. In such a structure, filled conductors stacked on both sides sandwiching filled conductor 12 in core substrate 10 are not line up along a straight line (along axis Z). Therefore, it is thought that thermal stress repeatedly exerted from heat cycles is mitigated.

It is thought that thermal stress from heat cycles is generated primarily because of the difference in thermal expansion coefficients between insulation layers (resin) and via conductors (metal).

Also, in wiring board 100 of the present embodiment, through holes (102*a*) are formed and plating (conformal conductors 102) is formed on the wall surfaces of through holes (102*a*). Hereinafter, such a structure is referred to as a through-hole structure.

Since filled-stack structure "S" is bent in a shifted-stack structure, there is a concern that resistance to stress exerted in directions Z decreases. By contrast, since conformal conductors 102 extend straight in directions Z in a through-hole structure, it is thought that resistance to stress exerted in directions Z increases. Therefore, it is thought that a decrease in strength caused by a shifted-stack structure is reinforced by a through-hole structure.

Since the opening shape of through holes (102*a*) is set as an ellipse, it is thought that strength in a wider region on the X-Y plane is effectively enhanced.

The above shifted-stack structure and through-hole structure are more effective as the number of layers (the number of conductive layers) in a wiring board increases. Those structures are especially effective when they are used in a wiring board having six or more layers (the number of conductive layers) where two or more conductive layers and two or more insulation layers are alternately laminated on both sides of the core substrate. In the following, the reasons are described with reference to FIGS. 7-9.

Figure 7:
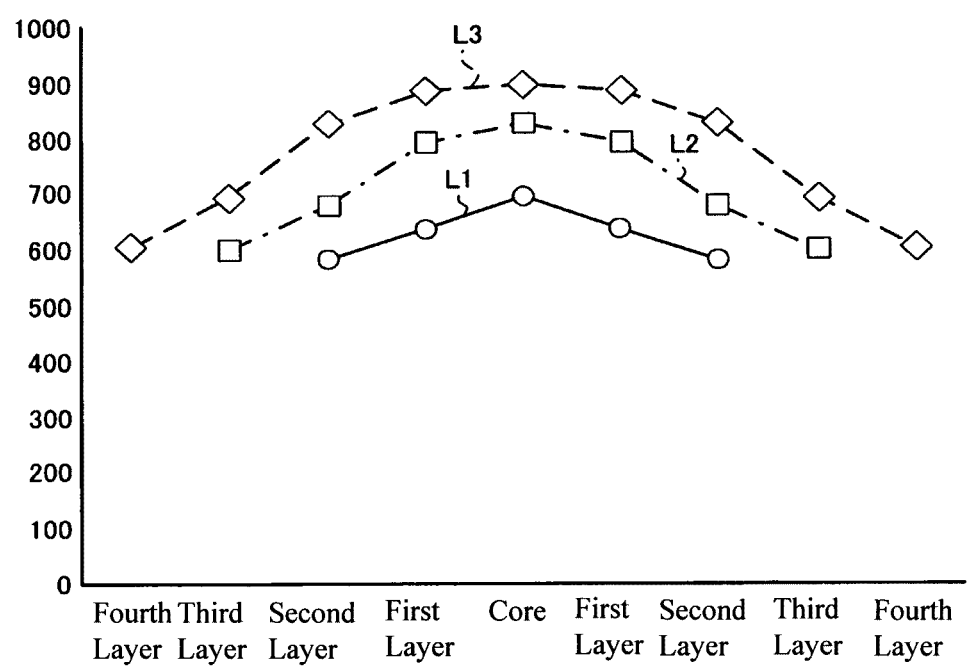
FIG. 7 is a graph showing the simulation results regarding stress exerted on wiring boards having six layers, eight layers and 10 layers respectively.
Figure 8:
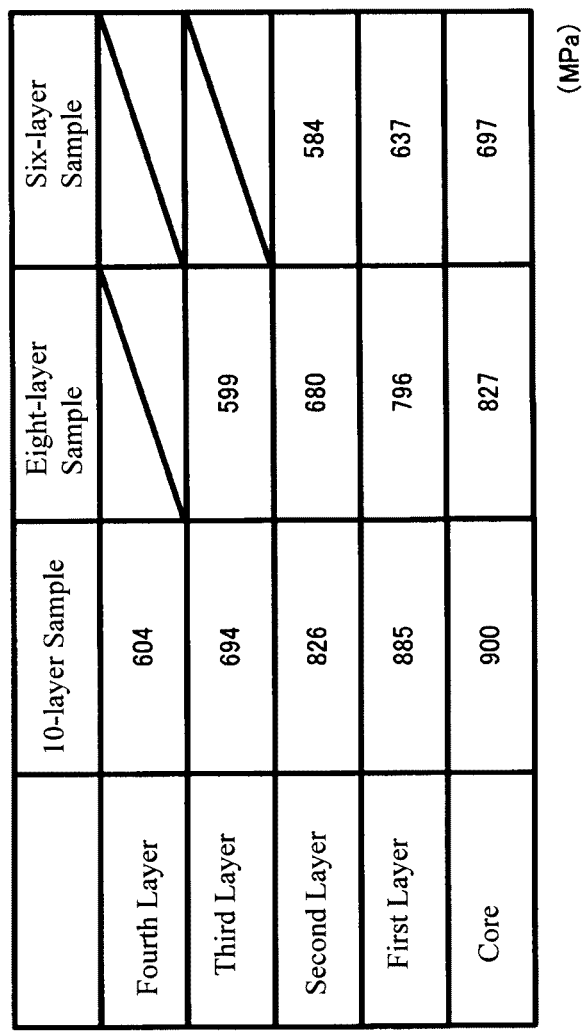
FIG. 8 is a chart showing the simulation results regarding stress exerted on wiring boards having six layers, eight layers and 10 layers respectively.

FIGS. 7 and 8 show simulation results regarding stress (especially thermal stress from heat cycles) exerted on wiring boards having six layers, eight layers and 10 layers (six-layer sample, eight-layer sample and 10-layer sample). The six-layer sample, eight-layer sample and 10-layer sample each have a full stack structure. In FIG. 7, line (L1) indicates data on the six-layer sample, line (L2) indicates data on the eight-layer sample and line (L3) indicates data on the 10-layer sample.

As shown in FIGS. 7 and 8, stress on the core is the greatest, and stress decreases layer by layer farther from the core in each of the six-layer, eight-layer and 10-layer samples. When stress exerted on each of the six-layer, eight-layer and 10-layer samples are compared, stress on a 10-layer sample is the greatest, stress on an eight-layer sample is second, and stress on a six-layer sample is the smallest. Thus, it is assumed that stress in a wiring board would increase as the number of layers increases.

FIG. 9 shows simulation results regarding the percentage of cracks occurring in each layer of an eight-layer sample and a 10-layer sample.

As shown in FIG. 9, it is thought that the majority of cracks is concentrated in the core (core substrate). Therefore, there is a concern that connection reliability in the core is lowered.

In addition, as shown in FIG. 9, cracking may also occur in a first layer (insulation layer on the core substrate). Thus, if only the via conductors in the core substrate are reinforced, there is a further concern that cracking is concentrated in the via conductors in an upper layer (a first layer). Also, since it is thought that the greater the number of layers, the greater the stress on the wiring board as described above, it is thought that cracking around the core occurs more often as the number of layers of a wiring board increases.

For that matter, if the above shifted-stack structure is employed in wiring board 100 of the present embodiment, there are fewer regions where strength is lowered as described above. Therefore, it is thought that cracking is suppressed near the core.

Also, if the above through-hole structure is employed in wiring board 100 of the present embodiment, it is thought that a decrease in strength caused by the shifted-stack structure is reinforced as described above. Therefore, it is thought that cracking is suppressed near the core. Moreover, since the through-hole structure reinforces all the layers of wiring board 100 evenly, there is less chance that stress is concentrated in still another region, compared with a structure in which core substrate 10 is reinforced locally. Accordingly, it is thought that cracking is suppressed not only in core substrate 10, but also in upper layers of core substrate 10 (insulation layers 20a-70a).

In addition, since cracking is more likely to occur if there are six or more layers, especially if there are eight or more layers, it is thought that the above shifted-stack structure is especially effective if employed in a wiring board having six or more layers, especially having eight or more layers. Wiring board 100 of the present embodiment has eight layers (conductive layers 11a, 11b, 21, 31, 41, 51, 61, 71). However, the present embodiment is not limited to such and a wiring board may also have seven or fewer layers or nine or more layers (for example, a wiring board having six layers or 10 layers) (see FIG. 40).

As described so far, according to the above shifted-stack structure and through-hole structure employed in wiring board 100 of the present embodiment, it is thought that a printed wiring board is obtained, featuring high heat radiation, low electrical resistance and highly integrated wiring.

Figure 10:
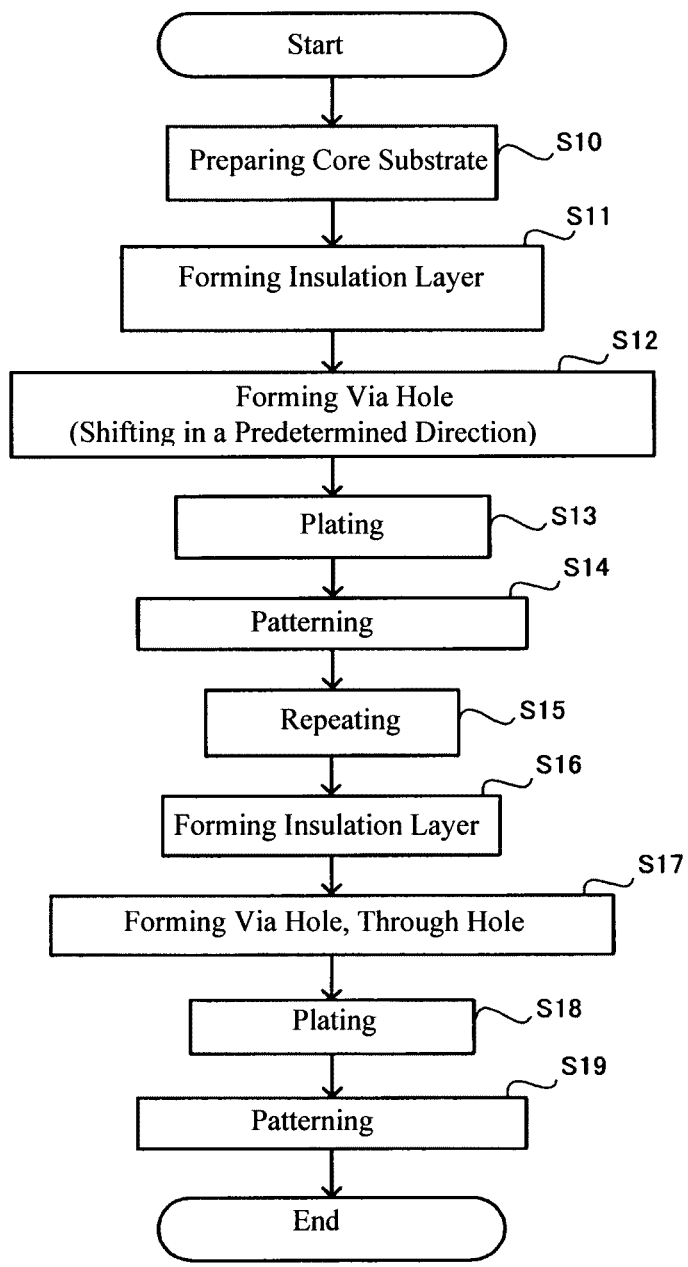
FIG. 10 is a flowchart showing a method for manufacturing a wiring board according to an embodiment of the present invention.

Wiring board 100 is manufactured by the procedure shown in FIG. 10, for example.

Core substrate 10 is prepared in step (S10).

A method for manufacturing core substrate 10 is shown in FIGS. 11A-11D.

Figure 11A:
FIG. 11A is a view to illustrate a first step for preparing a core substrate.

As shown in FIG. 11A, double-sided copper-clad laminate 1000 is prepared (starting material). Double-sided copper-clad laminate 1000 has insulation layer (10a) and copper foils (1001, 1002). Copper foil 1001 is formed on a first surface of insulation layer (10a) and copper foil 1002 is formed on a second surface of insulation layer (10a). As described previously, the material for insulation layer (10a) is epoxy resin with reinforcing material, for example.

Figure 11B:
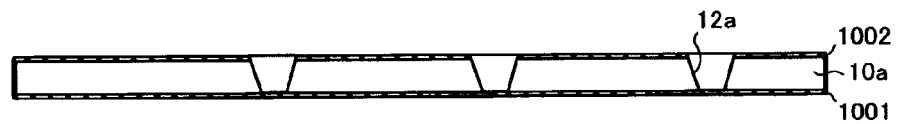
FIG. 11B is a view to illustrate a second step subsequent to the step in FIG. 11A.

As shown in FIG. 11B, via holes (12a) are formed in insulation layer (10a) by a laser, for example. Via holes (12a) penetrate through copper foil 1002 and insulation layer (10a), but do not penetrate through copper foil 1001. In doing so, via holes (12a) are formed penetrating from the second-surface side of insulation layer (10a) to reach copper foil 1001. Then, desmearing and soft etching are conducted if required.

Figure 11C:
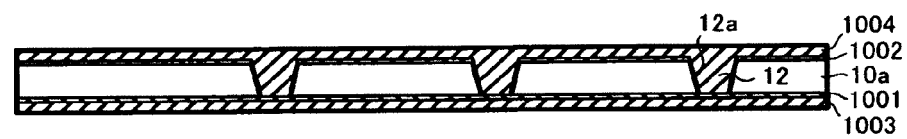
FIG. 11C is a view to illustrate a third step subsequent to the step in FIG. 11B.

As shown in FIG. 11C, copper panel plating (plating in via holes (12a) and on the entire surface), for example, is performed to form plating 1003 on the first surface of copper foil 1001 and plating 1004 on the second surface of copper foil 1002 and inside via holes (12a). Accordingly, plating 1004 is filled in via holes (12a). As a result, filled conductors 12 are formed. Platings (1003, 1004) are formed by, for example, electroless plating followed by electrolytic plating using the electroless plated film as a cathode (see later-described FIG. 31A). As for the plating solution for electroless plating, a copper-sulfate solution containing a reduction agent may be used, for example. Also, as for the plating solution for electrolytic plating, a copper sulfate solution, a copper pyrophosphate solution, a cyanide copper plating solution, a copper borofluoride solution or the like may be used.

Figure 11D:
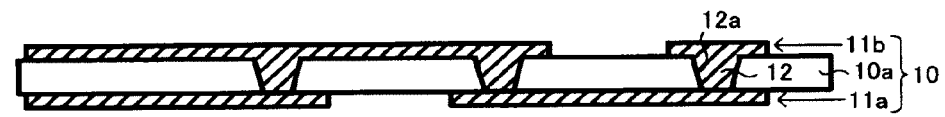
FIG. 11D is a view to illustrate a fourth step subsequent to the step in FIG. 11C.

As shown in FIG. 11D, conductive layers on both surfaces of insulation layer (10a) are patterned by a lithographic technique, for example. In doing so, conductive layer (11a) is formed on the first surface of insulation layer (10a) and conductive layer (11b) is formed on the second surface of insulation layer (10a). As a result, core substrate 10 is completed.

Insulation layers are formed on both sides of core substrate 10 in step (S11) in FIG. 10.

Figure 12A:
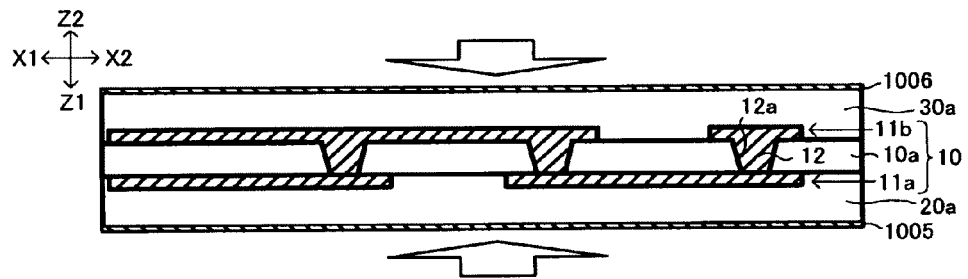
FIG. 12A is a view to illustrate a step for forming insulation layers on both sides of the core substrate.

In particular, as shown in FIG. 12A, for example, copper foil 1005, insulation layer (20a), core substrate 10, insulation layer (30a) and copper foil 1006 are positioned in that order from the first-surface side. Accordingly, a laminate is formed. In such a laminate, core substrate 10 is sandwiched by insulation layers (20a, 30a), which are then sandwiched by copper foils (1005, 1006). At that stage, insulation layers (20a, 30a) are prepreg (semi-cured adhesive sheets). However, RCF (resin-coated copper foil) or the like may also be used instead of prepreg.

The laminate is thermal pressed in directions Z. Namely, pressing and heating are conducted simultaneously. Prepreg (insulation layers 20a, 30a) is cured through pressing and heating, and members are adhered. As a result, the laminate becomes integrated. Pressing and heating may be divided into multiple procedures. Also, heating and pressing may be conducted separately, but it is more efficient if they are conducted at the same time. After thermal pressing, another heating procedure for integration may be conducted separately.

In step (S12) in FIG. 10, via holes are formed in insulation layers on both sides of core substrate 10.

Figure 12B:
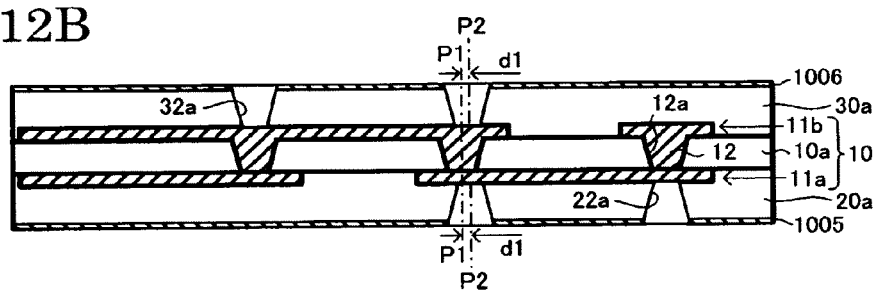
FIG. 12B is a view to illustrate a step for forming via holes subsequent to the step in FIG. 12A.

In particular, using a laser, for example, via holes (22a) are formed in insulation layer (20a) and via holes (32a) are formed in insulation layer (30a) as shown in FIG. 12B, for example. During that time, via holes (22a, 32a) for forming filled-stack structure "S" are formed by being shifted from filled conductor 12 (via conductor) in a lower layer (core substrate 10) in a predetermined direction (for example, toward X2). Accordingly, axis (P2) of filled conductors (22, 32) that form filled-stack structure "S" is shifted from axis (P1) of filled conductor 12 toward X2 by shifting amount (d1). If required, black-oxide treatment is preferred to be done before holes are bored (laser irradiation).

Plating is performed in step (S13) in FIG. 10.

Figure 12C:
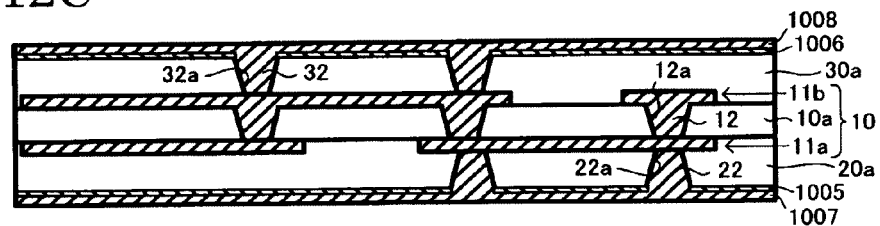
FIG. 12C is a view to illustrate a plating step subsequent to the step in FIG. 12B.

Specifically, as shown in FIG. 12C, by copper panel plating, for example, plating 1007 is formed on the first surface of copper foil 1005 and in via holes (22a), and plating 1008 is formed on the second surface of copper foil 1006 and in via holes (32a). Accordingly, platings (1007, 1008) are filled in via holes (22a, 32a) respectively. As a result, filled conductors (22, 32) are formed. Platings (1007, 1008) are formed by electroless plating followed by electrolytic plating using the electroless plated film as a cathode, the same as shown in the step in FIG. 11C, for example (see later-described FIG. 31A).

Conductive layers are patterned in step (S14) in FIG. 10.

Figure 12D:
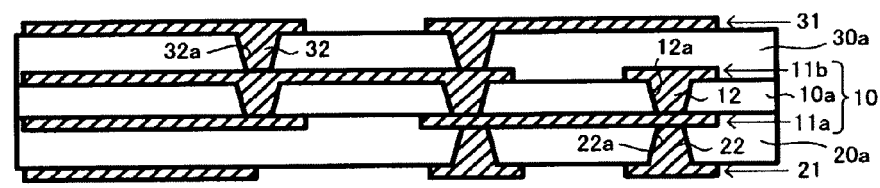
FIG. 12D is a view to illustrate a patterning step subsequent to the step in FIG. 12C.

Specifically, as shown in FIG. 12D, conductive patterns on both surfaces are patterned by a lithographic technique, for example. Accordingly, conductive layer 21 is formed on the first surface of insulation layer (20a) and conductive layer 31 is formed on the second surface of insulation layer (30a).

Figure 13:
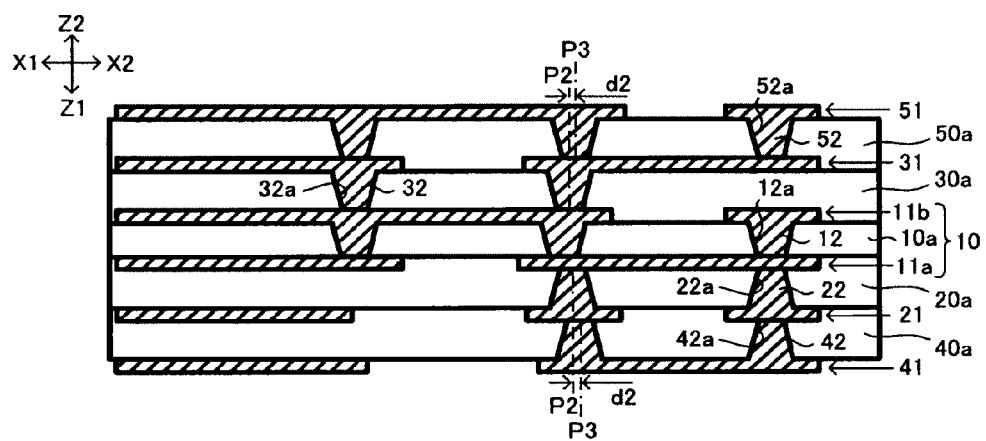
FIG. 13 is a view to illustrate a step for building up on both sides of the core substrate subsequent to the step in FIG. 12D.

In step (S15) in FIG. 10, by repeating the steps (S11)~(S14), insulation layers (40a, 50a), via holes (42a, 52a), filled conductors (42, 52) and conductive layers (41, 51) are formed as shown in FIG. 13. Regarding positions of filled conductors (42, 52) which form filled-stack structure "S," axis (P3) of filled conductor 42 is shifted toward X2 by shifting amount (d2) from axis (P2) of filled conductor 22, and axis (P3) of filled conductor 52 is shifted toward X2 by shifting amount (d2) from axis (P2) of filled conductor 32.

Insulation layers are formed on both sides of core substrate 10 in step (S16) in FIG. 10.

Figure 14:
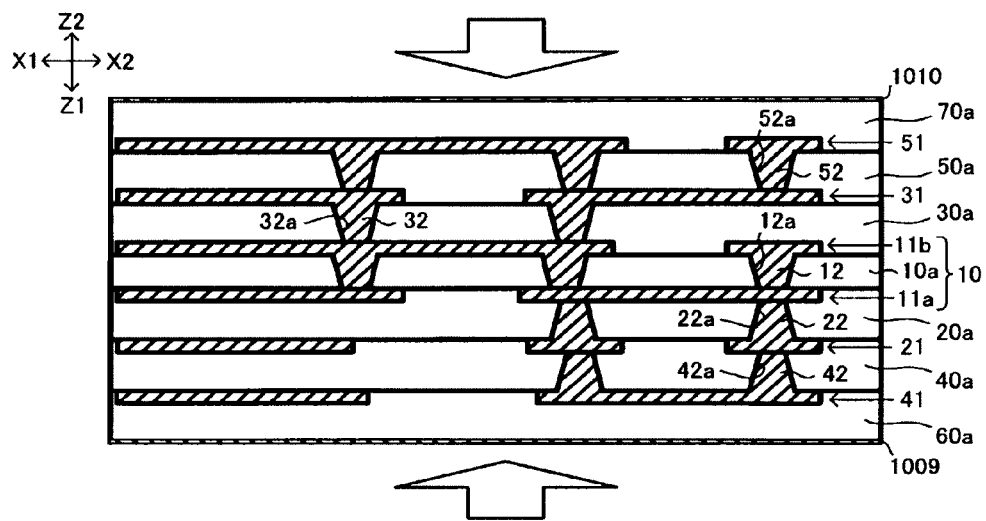
FIG. 14 is a view to illustrate a step for forming insulation layers on both sides of the core substrate subsequent to the step in FIG. 13.

Specifically, as shown in FIG. 14, for example, insulation layer (60a) and copper foil 1009 are laminated on the first-surface side of core substrate 10, and insulation layer (70a) and copper foil 1010 are laminated on the second-surface side of core substrate 10. Then, the laminate is thermal pressed in directions Z. Accordingly, prepreg (insulation layers 60a, 70a) is cured, and members are adhered to each other. As a result, the laminate becomes integrated. Here, the pressing and heating may be divided into multiple procedures. Also, heating and pressing may be conducted separately. However, it is more efficient if they are conducted simultaneously. After thermal pressing, another heating process for integration may be conducted separately.

In step (S17) in FIG. 10, via holes are formed in insulation layers on both sides of core substrate 10 along with a through hole formed to penetrate through all the layers.

Figure 15A:
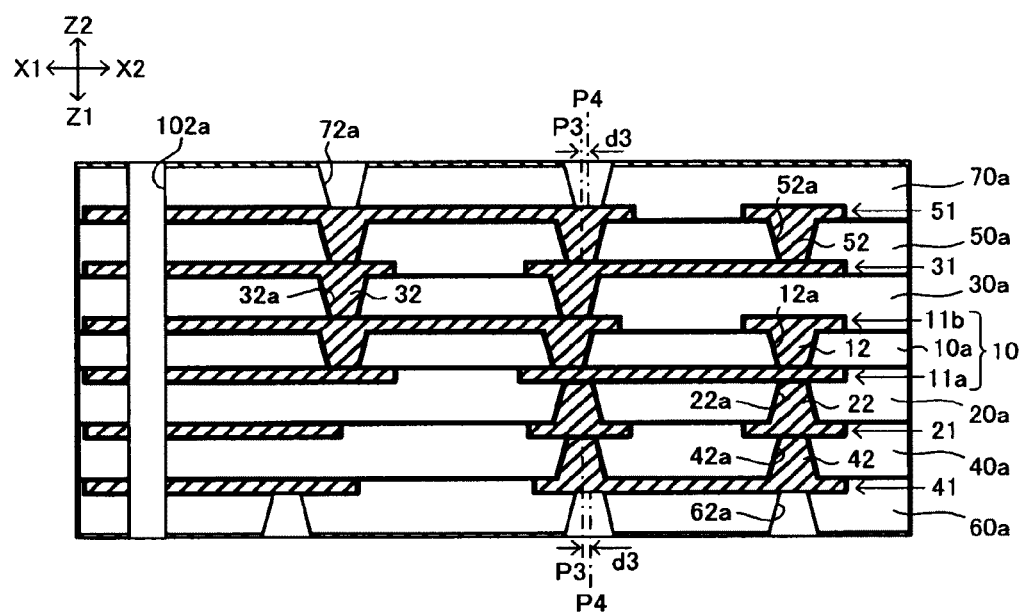
FIG. 15A is a view to illustrate a step for forming via holes and through holes subsequent to the step in FIG. 14.

Specifically, as shown in FIG. 15A, via holes (62a) penetrating through insulation layer (60a), via holes (72a) penetrating through insulation layer (70a) and through holes (102a) penetrating through all the layers are formed by a laser, for example. Then, desmearing and soft etching are conducted, if required.

When irradiating a laser, laser light is irradiated on the entire surface of an object while a shading mask is placed on the object, for example. However, the present embodiment is not limited to such, and instead of using a shading mask, laser light may be irradiated only on the required portions by halting irradiation at portions where irradiation is not required. Also, while scanning laser light, the laser light intensity (amount of light) for irradiating on portions to form through holes (102a) may be increased from the laser light intensity for irradiating on portions to form via holes (62a, 72a) so that via holes (62a, 72a) and through holes (102a) are formed by being scanned once. During that time, the laser intensity (amount of light) is preferred to be adjusted by pulse control. In particular, for example, when modifying laser intensity, the number of shots (irradiation number) is changed without modifying the laser intensity per shot (one irradiation). Namely, if the required laser intensity is not obtained with one shot, laser light is irradiated again on the same spot. Using such a control method, it is thought that throughput is enhanced, since time for changing irradiation conditions is omitted. However, a method for adjusting laser intensity is not limited specifically. For example, irradiation conditions may be determined for each irradiation spot, while the number of irradiations is set as constant (for example, one shot per irradiation spot).

Via holes (62a, 72a) to form filled-stack structure "S" are formed by being shifted in a predetermined direction (for example, toward X2) from filled conductors (42, 52) (via conductors) formed in the lower layers (insulation layers 40a, 50a). Accordingly, regarding the positions of filled conductors (62, 72) that form filled-stack structure "S," axis (P4) of filled conductor 62 is shifted toward X2 by shifting amount (d3) from axis (P3) of filled conductor 42, and axis (P4) of filled conductor 72 is shifted toward X2 by shifting amount (d3) from axis (P3) of filled conductor 52.

Plating is performed in step (S18) in FIG. 10.

Figure 15B:
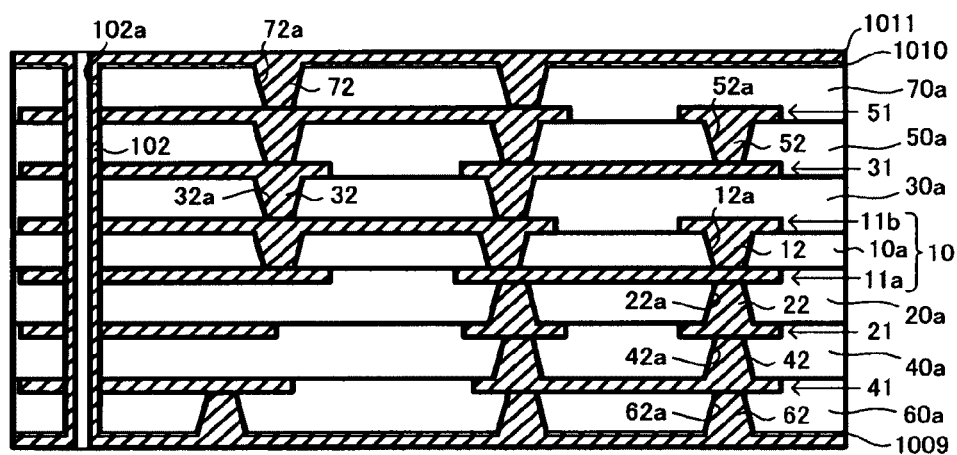
FIG. 15B is a view to illustrate a plating step subsequent to the step in FIG. 15A.

Specifically, as shown in FIG. 15B, by performing copper panel plating, for example, plating 1011 is formed on the first surface of copper foil 1009, in via holes (62a), on the second surface of copper foil 1010, in via holes (72a) and in through holes (102a). Accordingly, plating 1011 is filled in via holes (62a, 72a), and plating 1011 is also formed on the wall surfaces of through holes (102a). As a result, filled conductors (62, 72) along with conformal conductors 102 are formed. The same as in the step in FIG. 11C, for example, plating 1011 is formed by electroless plating followed by electrolytic plating using the electroless plated film as a cathode (see later-described FIG. 31A). In the present embodiment, forming plating 1011 on the wall surfaces of through holes (102a) and forming plating 1011 in outermost via holes (via holes 62a, 72a) are carried out simultaneously. Accordingly, it is thought that a reduction in the number of steps and in cost is achieved.

In step (S19) in FIG. 10, conductive layers on both surfaces are patterned by a lithographic technique, for example. Accordingly, as previously shown in FIG. 1, conductive layer 61 is formed on the first surface of insulation layer (60a) and conductive layer 71 is formed on the second surface of insulation layer (70a). As a result, wiring board 100 is completed. Then, by forming external connection terminals on the outermost layers, for example, connecting wiring board 100 to other wiring boards or mounting electronic components on wiring board 100 is achieved through such external connection terminals (see later-described FIG. 39).

Any other method may be used for forming conductive patterns. For example, each conductive layer may be formed by a so-called pattern plating method, in which only the portions to be patterned are selectively plated using plating resist.

So far, a wiring board and its manufacturing method according to an embodiment of the present invention are described. However, the present invention is not limited to the above embodiment.

Figure 16:
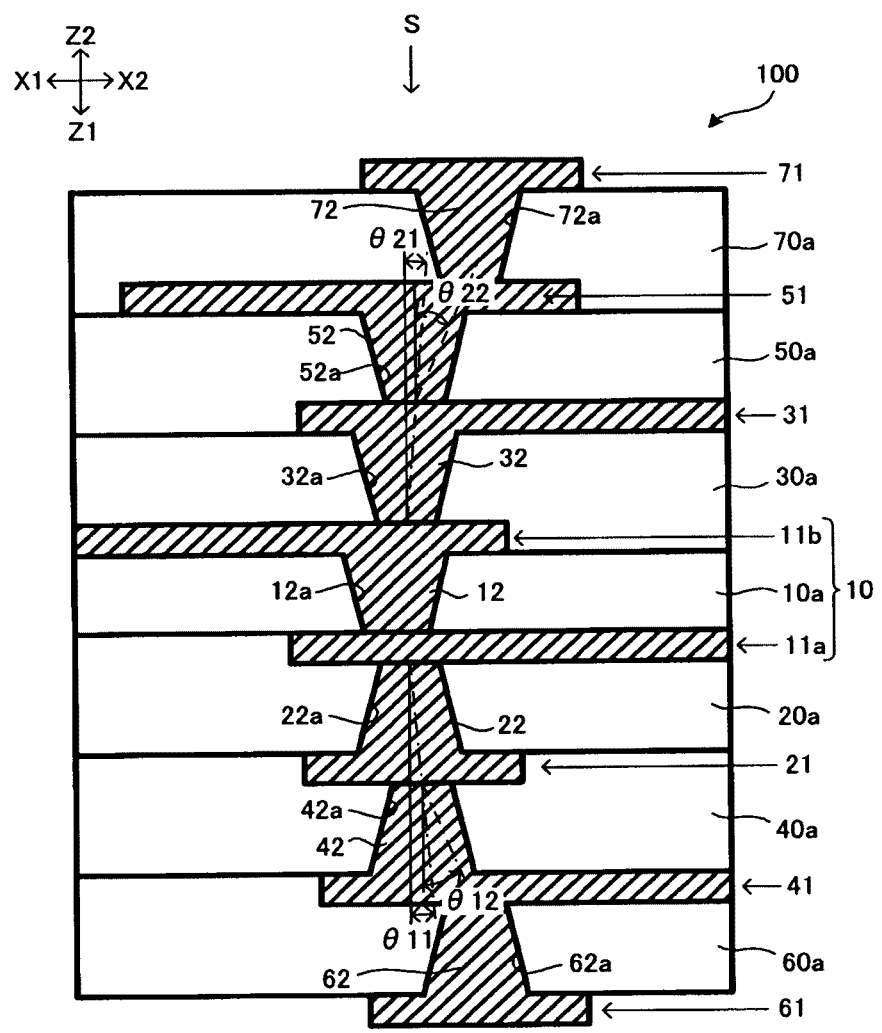
FIG. 16 is a view showing an example in which shifting angles of filled conductors in a filled-stack structure are not constant.

Shifting angles in filled-stack structure "S" are not always required to be substantially constant. For example, as shown in FIG. 16, the shifting angle (angle θ12) from filled conductor 42 toward filled conductor 62 may be set greater than the shifting angle (angle θ11) from filled conductor 22 toward filled conductor 42. Also, the shifting angle (angle θ22) from filled conductor 52 toward filled conductor 72 may be set greater than the shifting angle (angle θ21) from filled conductor 32 toward filled conductor 52.

The positional relationship of adjacent filled conductors in filled-stack structure "S" is not limited to those shown previously in FIGS. 5A and 5B. In short, it is sufficient as long as at least each filled conductor is stacked.

Figure 17:
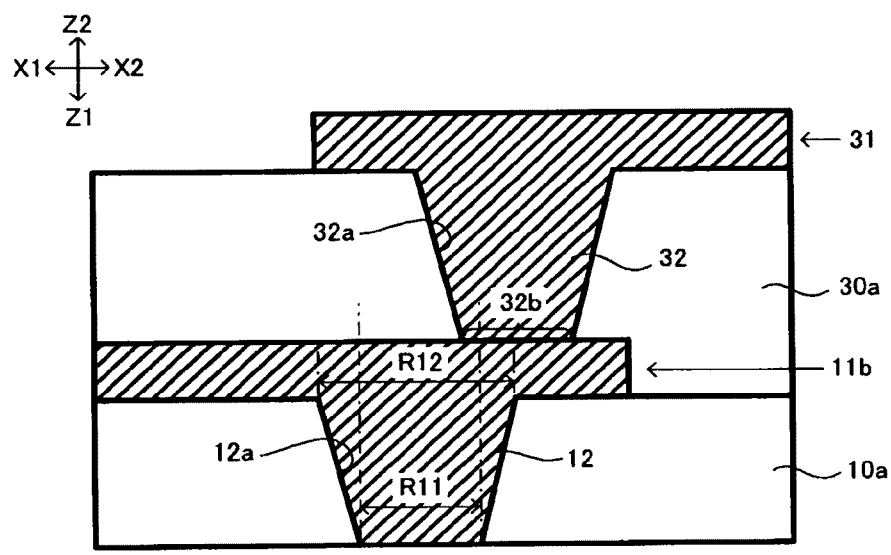
FIG. 17 is a view showing a first alternative example of the positional relationship in a filled-stack structure between a filled conductor in the core substrate and a filled conductor stacked on its second surface.
Figure 18:
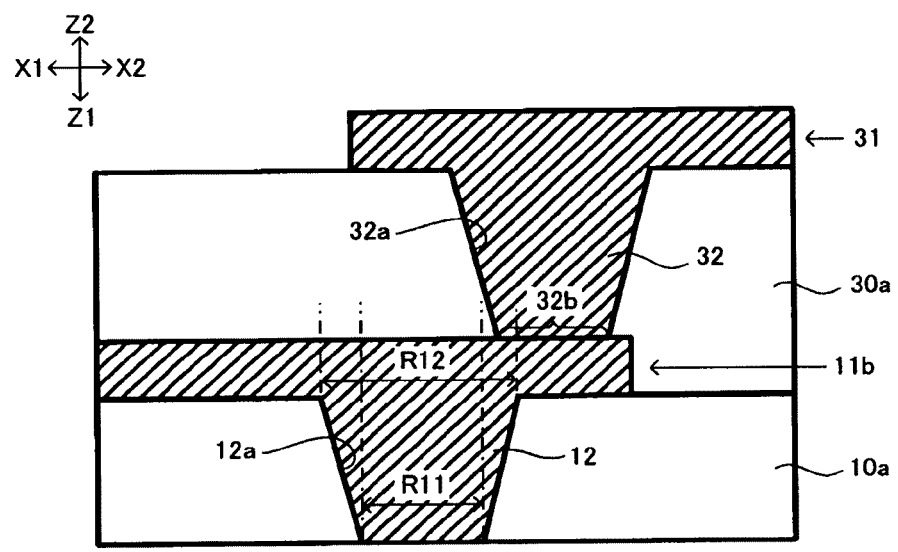
FIG. 18 is a view showing a second alternative example of the positional relationship in a filled-stack structure between a filled conductor in the core substrate and a filled conductor stacked on its second surface.

When filled conductors having the same tapering direction are stacked, for example, when filled conductor 32 is stacked on the second-surface side of filled conductor 12, instead of the positional relationship in FIG. 5A, one edge (the inner edge) of the lower-layer side end surface (32b) (the first-surface side) of filled conductor 32 may be positioned within range (R11), while the other edge (the outer edge) is positioned outside range (R12) as shown in FIG. 17. Alternatively, as shown in FIG. 18, one edge (the inner edge) of the lower-layer side end surface (32b) (the first-surface side) of filled conductor 32 may be positioned outside range (R11) but within range (R12), while the other edge (the outer edge) is positioned outside range (R12). The same applies to the following: when filled conductor 52 is stacked on the second-surface side of filled conductor 32; when filled conductor 72 is stacked on the second-surface side of filled conductor 52; when filled conductor 22 is stacked on the first-surface side of filled conductor 12; when filled conductor 42 is stacked on the first-surface side of filled conductor 22; and when filled conductor 62 is stacked on the first-surface side of filled conductor 42.

Figure 19:
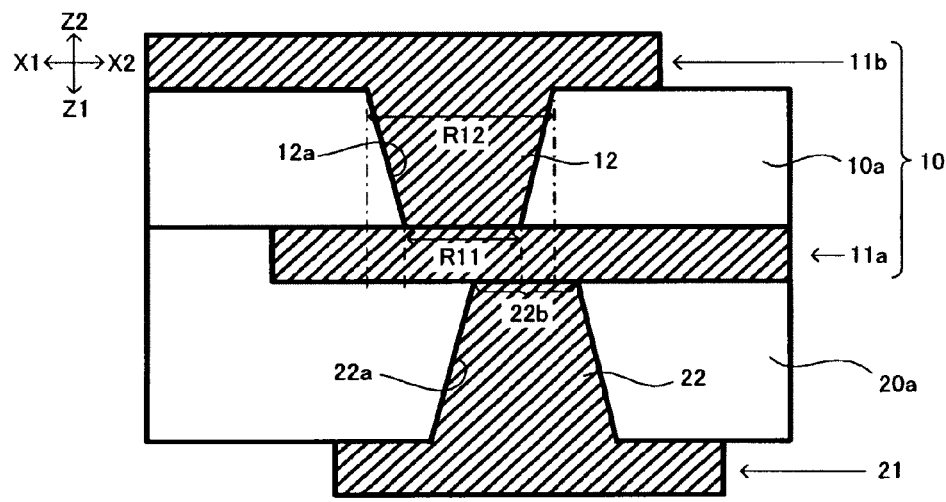
FIG. 19 is a view showing a first alternative example of the positional relationship in a filled-stack structure between a filled conductor in the core substrate and a filled conductor stacked on its first surface.
Figure 20:
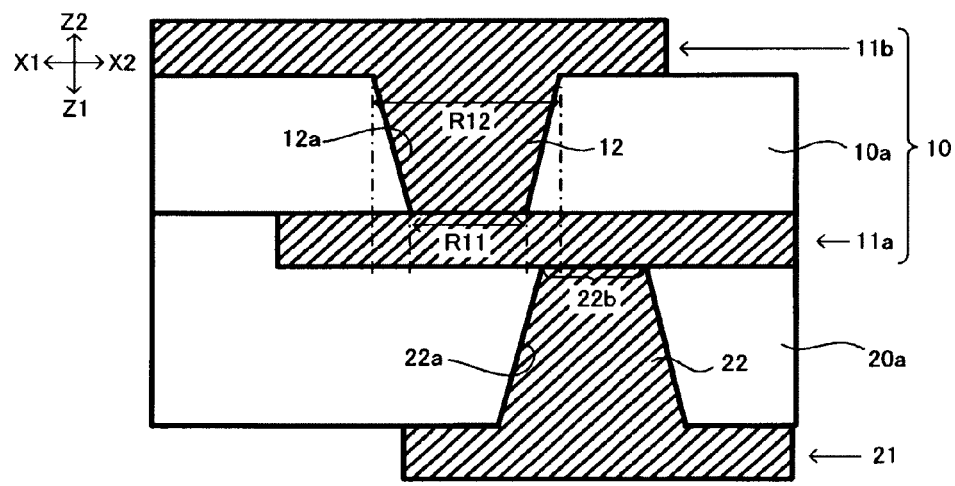
FIG. 20 is a view showing a second alternative example of the positional relationship in a filled-stack structure between a filled conductor in the core substrate and a filled conductor stacked on its first surface.

Alternatively, when filled conductors having opposite tapering directions are stacked, for example, when filled conductor 22 is stacked on the first-surface side of filled conductor 12, instead of the positional relationship shown in FIG. 5B, one edge (the inner edge) of the lower-layer side end surface (22b) (the second-surface side) of filled conductor 22 may be positioned within range (R11), while the other edge (the outer edge) is positioned outside range (R12) as shown in FIG. 19. Alternatively, as shown in FIG. 20, one edge (the inner edge) of the lower-layer side end surface (22b) (the second-surface side) of filled conductor 22 may be positioned outside range (R11) but within range (R12), while the other edge (the outer edge) is positioned outside range (R12).

Figure 21:
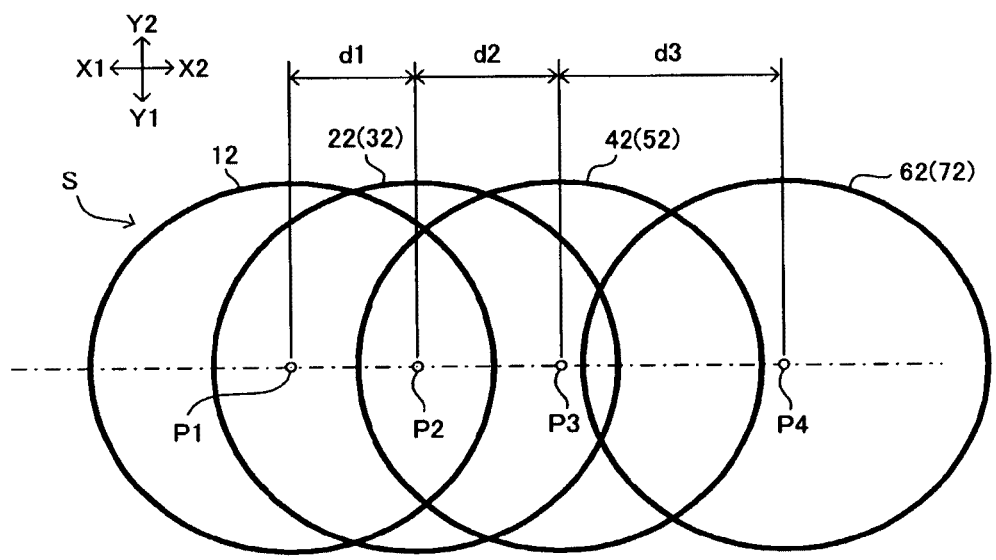
FIG. 21 is a view showing an example in which shifting amounts of filled conductors in a filled-stack structure are not constant.

It is not always required that the shifting amounts in filled-stack structure "S" be substantially constant. For example, as shown in FIG. 21, the above-described shifting amounts (d1, d2, d3) may be set so that shifting amount (d3) is the greatest, shifting amount (d2) is the second greatest, and shifting amount (d1) is the smallest.

Figure 22A:
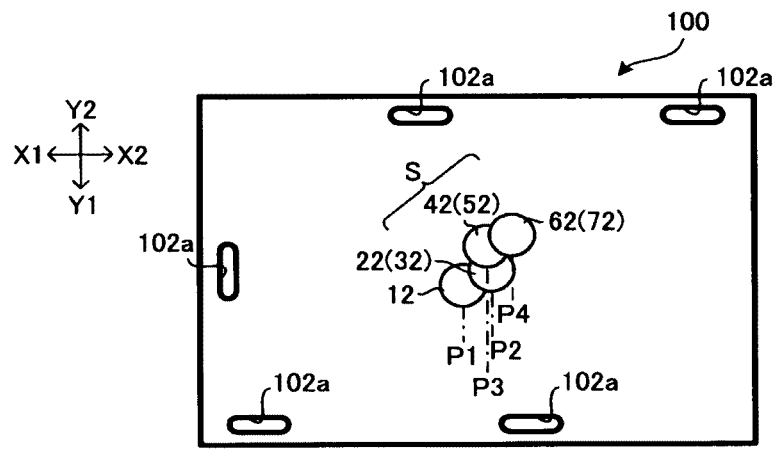
FIG. 22A is a view showing a first example in which positions of filled conductors in a filled-stack structure are staggered.
Figure 22B:
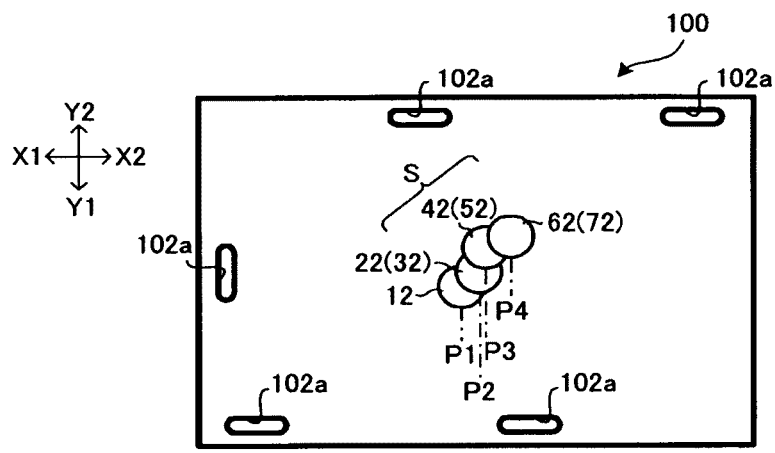
FIG. 22B is a view showing a second example in which positions of filled conductors in a filled-stack structure are staggered.

It is not always required that filled conductors (12, 22, 32, 42, 52, 62, 72) in filled-stack structure "S" are positioned along a straight line on the X-Y plane. For example, if each filled conductor in filled-stack structure "S" is shifted diagonally (in XY directions), positions of filled conductors (22, 42, 62) on the first-surface side of core substrate 10 and positions of filled conductors (32, 52, 72) on the second-surface side of core substrate 10 may each be staggered on the X-Y plane as shown in FIG. 22A or FIG. 22B. In short, as long as each filled conductor (connection conductor) in filled-stack structure "S" on both sides of core substrate 10 is positioned to be shifted in a substantially constant direction toward their respective upper-layer sides from core substrate 10, it is thought that effects such as suppressing cracks from occurring near the core are achieved as described above.

In the above embodiment, filled conductors (12, 22, 32, 42, 52, 62, 72) in filled-stack structure "S" on both sides of core substrate 10 are positioned to shift in a substantially constant direction (such as toward X2) from core substrate 10 toward their respective upper-layer sides (see FIGS. 2 and 4). However, the present embodiment is not limited to such. For example, even if each filled conductor in filled-stack structure "S" is not shifted in substantially a constant direction, as long as the positions of filled conductors (62, 72) (outer-layer connection conductors) are shifted from the position of filled conductor 12 (connection conductor of core substrate 10) in substantially the same direction on both sides of core substrate 10, it is thought that substantially the same effect is achieved as when each filled conductor in filled-stack structure "S" is shifted in substantially a constant direction.

Figure 23:
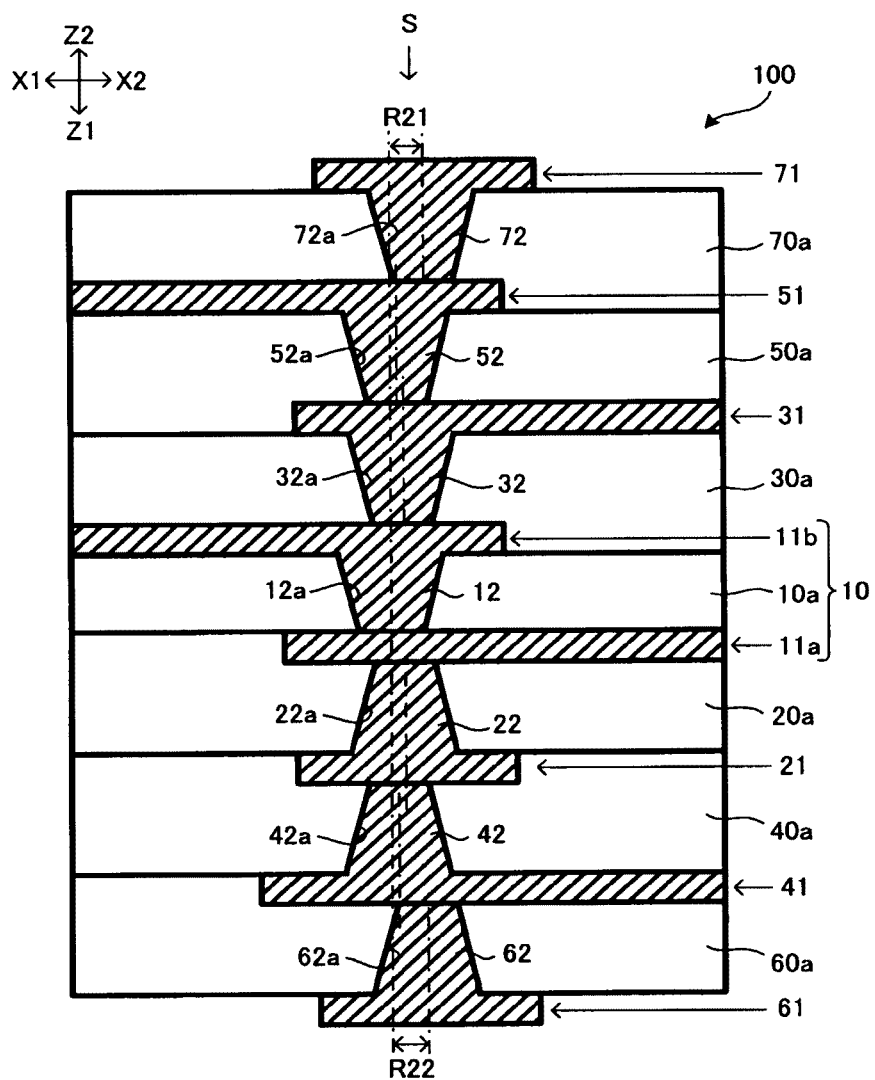
FIG. 23 is a cross-sectional view showing an example of a wiring board where shifting directions in a filled-stack structure are not substantially constant, and the position of an outer-layer connection conductor on one side and the position of an outer-layer connection conductor on the other side are shifted in substantially the same direction from the position of a connection conductor in the core substrate, while inner-layer connection conductors are positioned between the connection conductor in the core substrate and outer-layer connection conductors.
Figure 24:
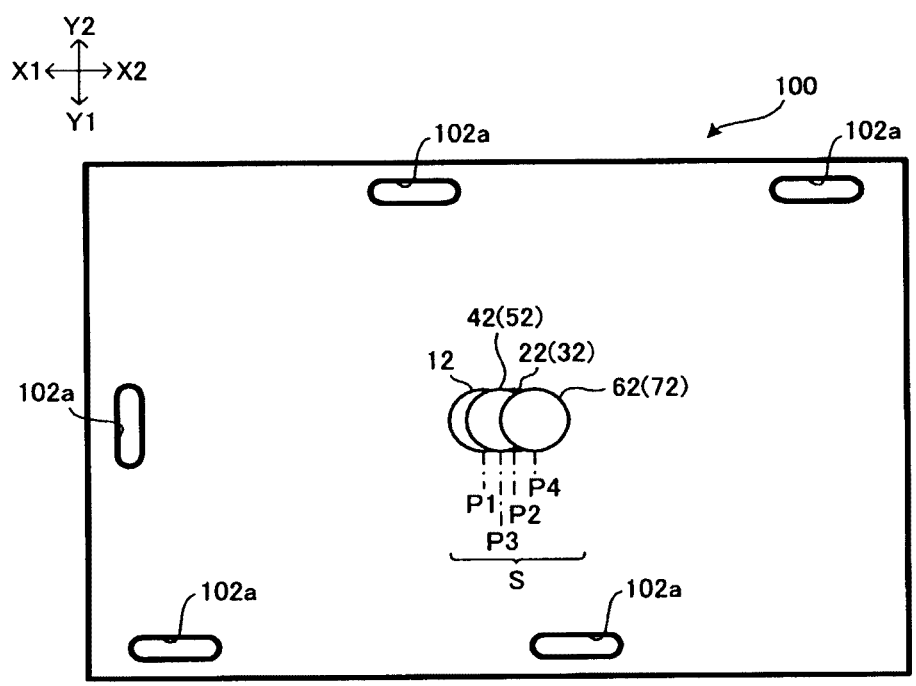
FIG. 24 is a plan view of the wiring board shown in FIG. 23.

For example, in the example shown in FIG. 23 (a view corresponding to FIG. 4) and FIG. 24 (a view corresponding to FIG. 2), the position of filled conductor 62 on the first-surface side and the position of filled conductor 72 on the second-surface side are shifted toward X2 from the position of filled conductor 12. Namely, the position of filled conductor 62 and the position of filled conductor 72 are shifted in the same direction. By employing such a structure, it is thought that effects such as suppressing cracks from occurring near the core are expected as described previously.

Figure 25:
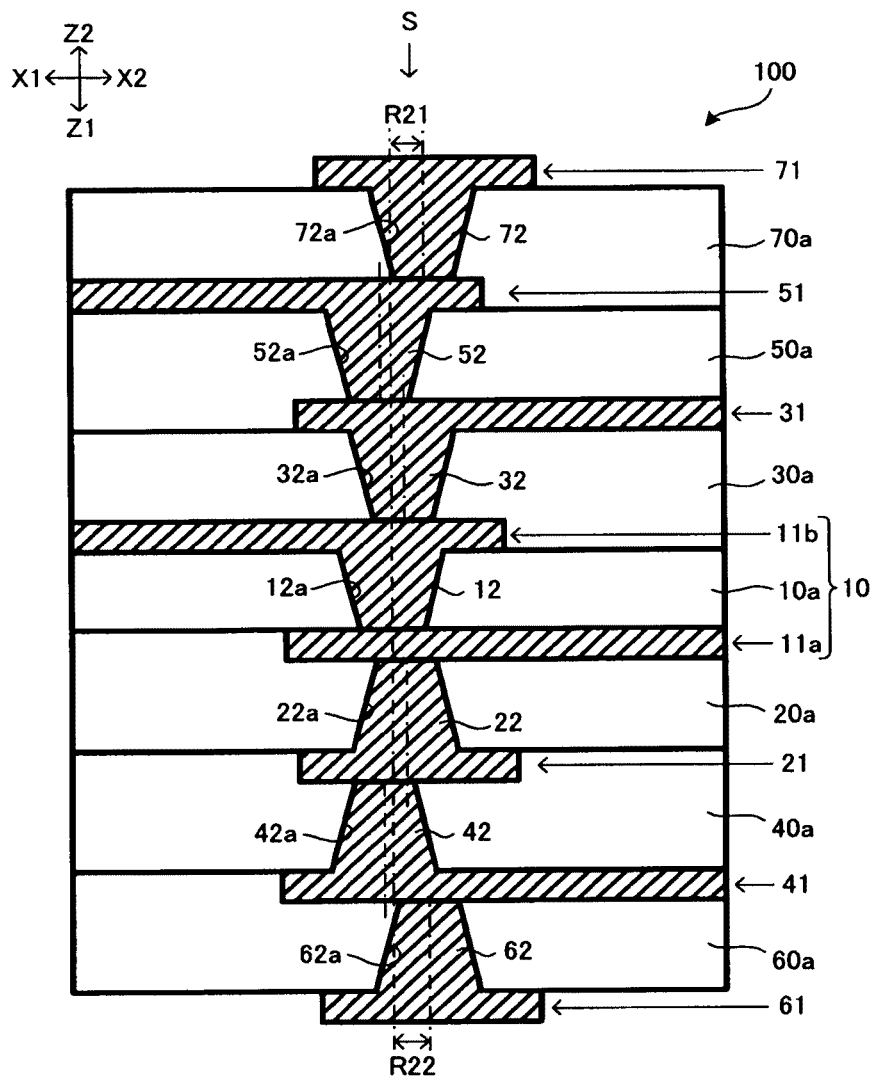
FIG. 25 is a cross-sectional view showing an example of a wiring board where shifting directions in a filled-stack structure are not substantially constant, and the position of an outer-layer connection conductor on one side and the position of an outer-layer connection conductor on the other side are shifted in substantially the same direction from the position of a connection conductor, while inner-layer connection conductors are not positioned between the connection conductor in the core substrate and outer-layer connection conductors.
Figure 26:
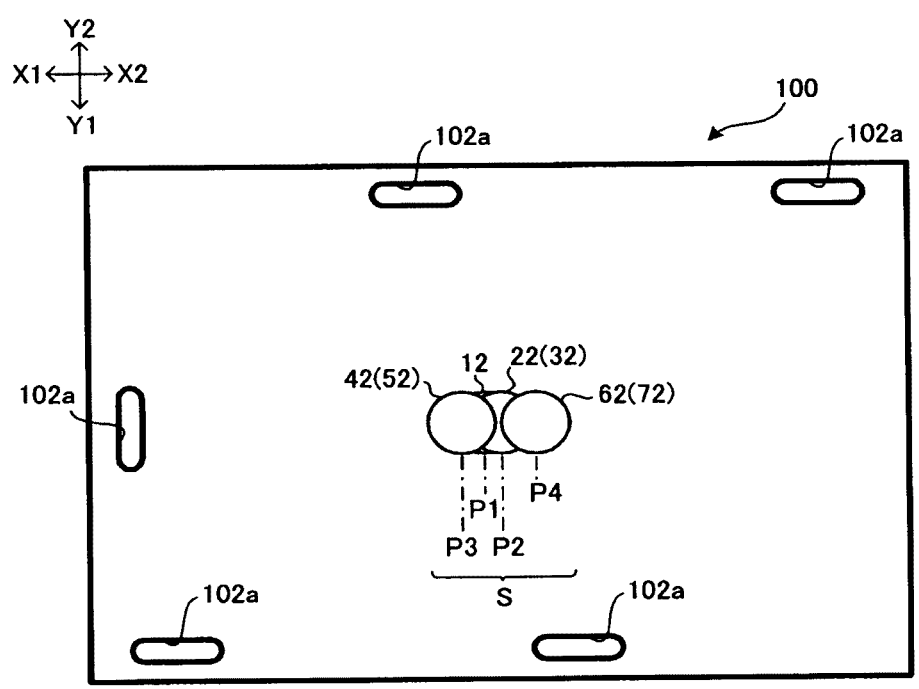
FIG. 26 is a plan view of the wiring board shown in FIG. 25.

Also, in the above example, filled conductors (22, 42) (inner-layer connection conductors on the first-surface side) are positioned between filled conductor 12 (connection conductor in core substrate 10) and filled conductor 62 (outer-layer connection conductor on the first-surface side) (range R21) in the direction (direction X) that filled conductor 62 is shifted. In addition, filled conductors (32, 52) (inner-layer connection conductors on the second-surface side) are positioned between filled conductor 12 (connection conductor in core substrate 10) and filled conductor 72 (outer-layer connection conductor on the second-surface side) (range R22) in the direction (direction X) that filled conductor 72 is shifted. By employing such positions, it is thought that above-described effects such as suppressing cracks from occurring near the core are enhanced. However, such positioning is not always required. For example, as shown in FIG. 25 (a view corresponding to FIG. 4) and FIG. 26 (a view corresponding to FIG. 2), filled conductors (42, 52) may also be positioned outside ranges (R21, R22) respectively.

The horizontal cross sections (on the X-Y plane) of via holes (12a) and the like and through holes (102a) in each layer may be determined freely.

Figure 27A:
FIG. 27A is a view of a first alternative example showing a horizontal cross-sectional shape of via holes and through holes.

For example, other than a perfect circle, those cross sections may be formed to be a square, as shown in FIG. 27A, for example, or any other regular polygon such as a regular hexagon or a regular octagon. In addition, the shape of angles of such polygons is not limited specifically; for example, it may be a right angle, an acute angle or an obtuse angle, or it may even be roundish. However, to prevent thermal stress from being concentrated, it is preferred that the angles be roundish.

Figure 27B:
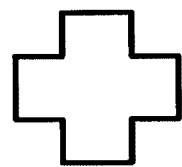
FIG. 27B is a view of a second alternative example showing a horizontal cross-sectional shape of via holes and through holes.
Figure 27C:
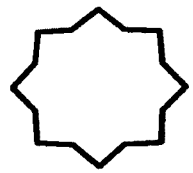
FIG. 27C is a view of a third alternative example showing a horizontal cross-sectional shape of via holes and through holes.

Alternatively, the above horizontal cross sections may be formed to be oval, rectangular, triangular or the like. Moreover, as shown in FIGS. 27B and 27C, shapes such as a cross or a regular polygonal star formed by drawing straight lines to radiate out from the center (shapes in which multiple spokes are positioned in a radial pattern) may be effective as the shape of the above horizontal cross sections.

Figure 28:
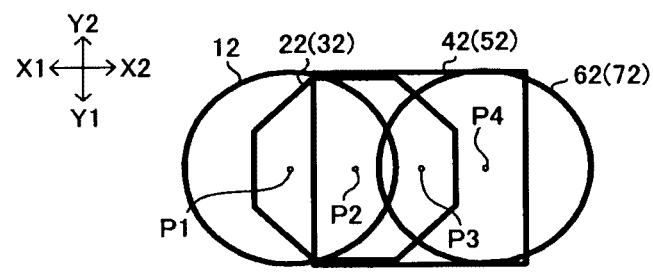
FIG. 28 is a view showing an example in which via holes with different shapes are combined to form a filled-stack structure.

The above shapes may be freely combined and used for the shapes of via hole (12a) and the like to form filled-stack structure "S." For example, as shown in FIG. 28, different shapes may be combined.

Figure 29A:
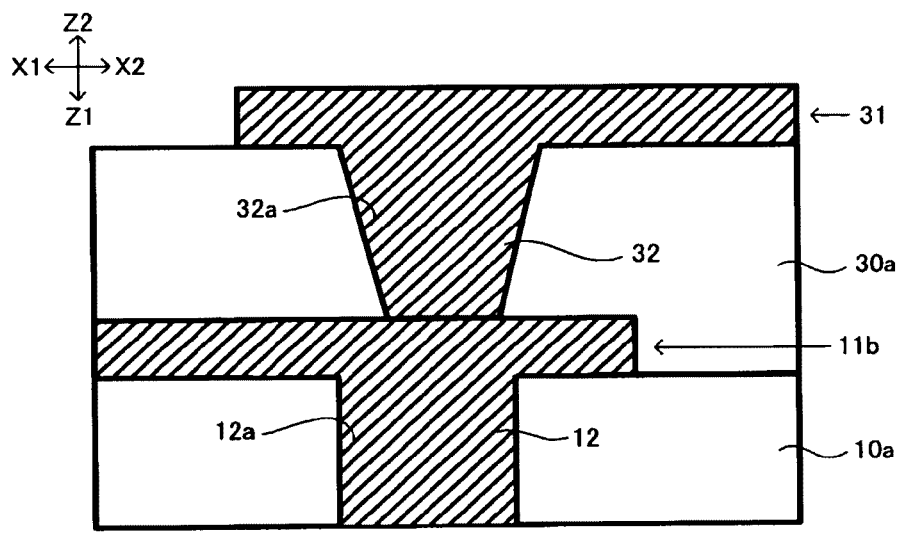
FIG. 29A is a view of a first alternative example showing a vertical cross-sectional shape of via holes and through holes.

The vertical cross sections of via holes (12a) and the like and through-holes (102a) in each layer may be formed freely. For example, as shown in FIG. 29A, via holes (12a) in the core section may be formed to be cylindrical. Also, via holes (22a) and the like in buildup sections may be formed to be cylindrical.

Figure 29B:
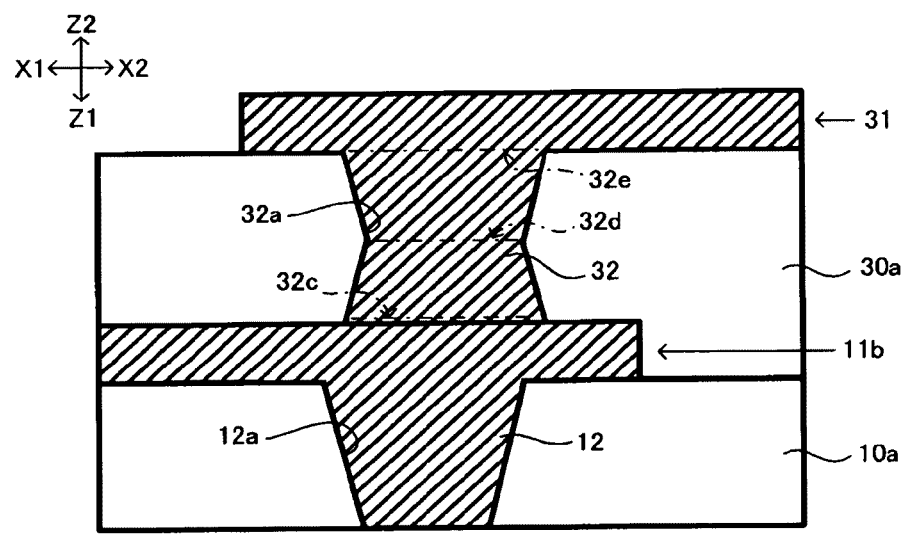
FIG. 29B is a view of a second alternative example showing a vertical cross-sectional shape of via holes and through holes.

Moreover, as shown in FIG. 29B, via hole (32a) may be formed like an hourglass. In such a shape, the width of narrowed portion (32d) positioned between opening portions (32c, 32e) on the first and second surfaces is set smaller than the widths of opening portions (32c, 32e). Thus, it is thought that the results of filling plating are enhanced. As a result, it is thought that surface flatness features are improved. Also, since the side surfaces of filled conductor 32 are slanted, the connection area increases between insulation layer (30a) and filled conductor 32. Accordingly, it is thought that their adhesive strength increases. Via holes (12a, 22a, 42a, 52a, 62a, 72a) and through holes (102a) may also be formed like an hourglass.

Figure 30A:
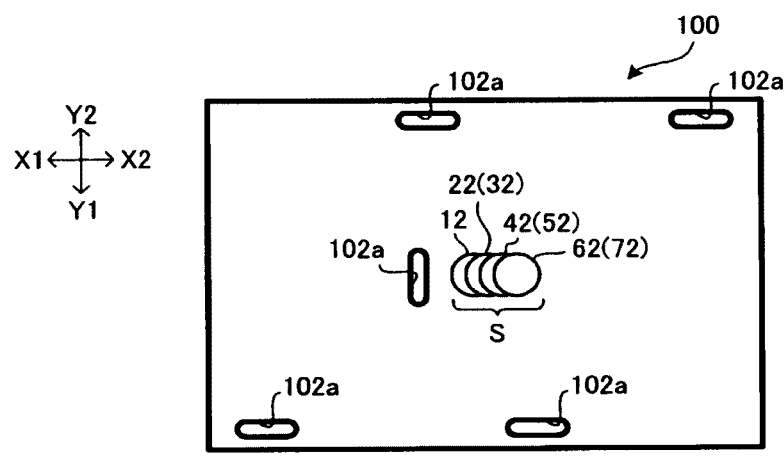
FIG. 30A is a view showing an example in which a through hole is positioned near a filled-stack structure.

Through holes (102a) are not limited to being positioned on the periphery of wiring board 100. For example, as shown in FIG. 30A, through hole (102a) may be positioned near filled-stack structure "S."

Figure 30B:
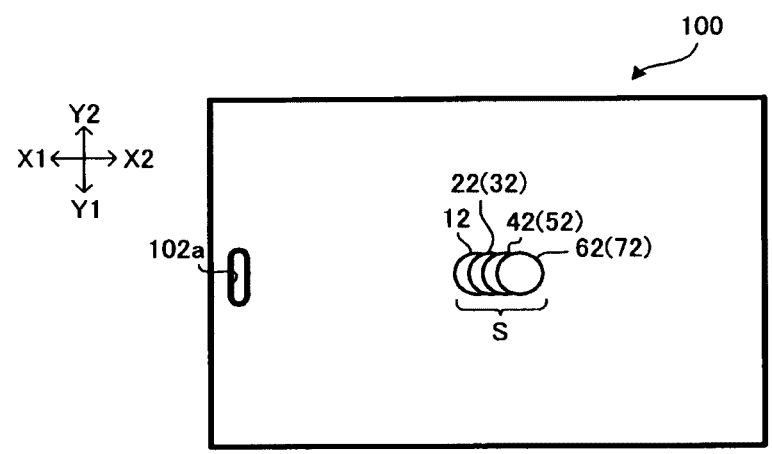
FIG. 30B is a view showing an example of a wiring board having only one through hole.

The number of through holes (102a) is not limited specifically. For example, as shown in FIG. 30B, the number of through holes (102a) may be one.

Conductive layers (11a, 11b, 21, 31, 41, 51, 61, 71) and filled conductors (22, 32, 42, 52, 62, 72) may be structured freely.

Figure 31A:
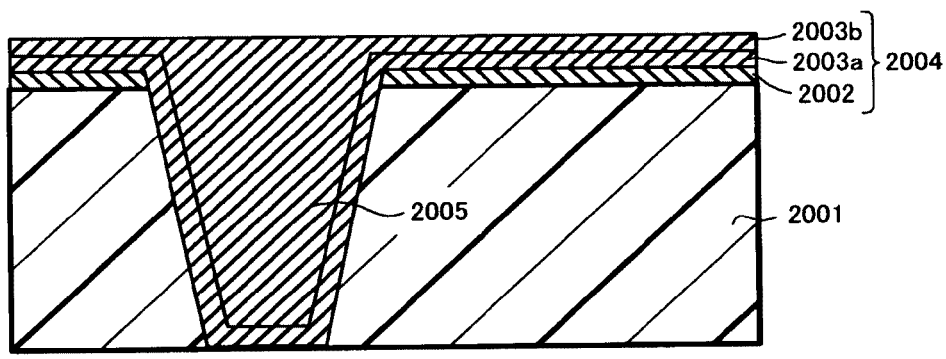
FIG. 31A is a view showing a first structure of a conductive layer and a via conductor.

For example, in the above embodiment, conductive layer (11a) and the like were structured to be triple-layered such as conductive layer 2004 shown in FIG. 31A, where metal foil 2002 (such as copper foil), electroless plated film (2003a) and electrolytic plated film (2003b) are laminated in that order on insulation layer 2001. Also, filled conductors 22 and the like were structured to be double-layered, such as filled conductor 2005 shown in FIG. 31A, which is formed with electroless plated film (2003a) and electrolytic plated film (2003b).

However, the structure of the above conductive layer (11a) and the like is not limited to the above. For example, they may be structured to be double layered by omitting electroless plated film (2003a), such as conductive layer 2004 shown in FIG. 31B. Also, above filled conductor 22 and the like may be structured only with electrolytic plated film (2003b).

Figure 31B:
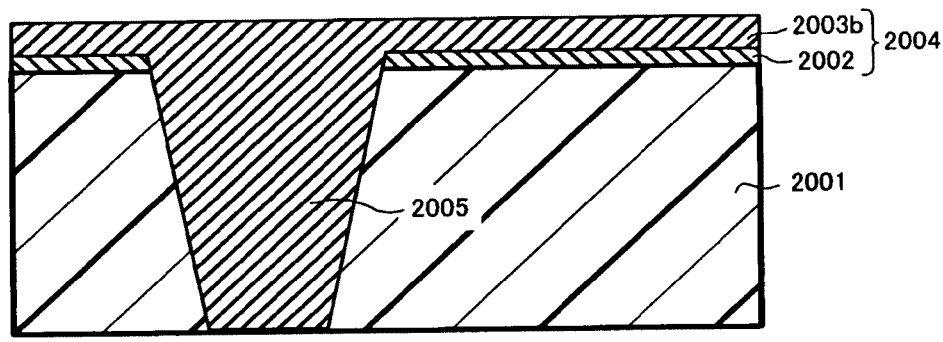
FIG. 31B is a view showing a second structure of a conductive layer and a via conductor.
Figure 31C:
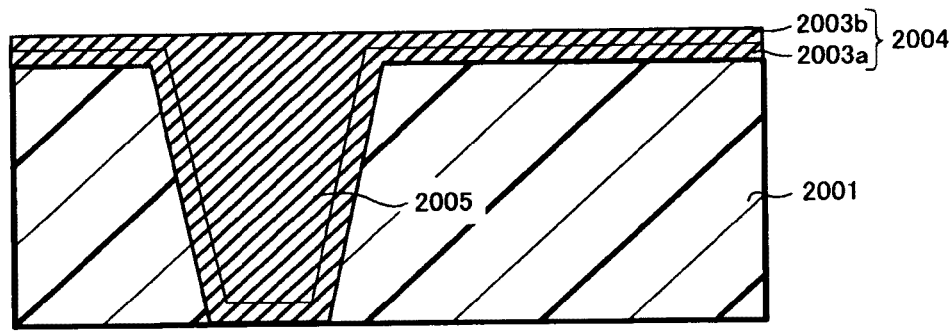
FIG. 31C is a view showing a third structure of a conductive layer and a via conductor.

Alternatively, as conductive layer 2004 shown in FIG. 31C, for example, conductive layer (11a) and the like may be structured to be double-layered by omitting metal foil 2002.

In FIGS. 31A~31C, via conductors are shown. However, the same structures may be employed for conformal conductors 102 (through-hole conductors). If electroless plated film (2003a) or the like is omitted, there is a concern that adhesiveness decreases in conductive layers. Thus, surface treatment to enhance adhesiveness is preferred to be conducted on insulation layer 2001 (insulation layer (10a) and the like) if required.

Figure 32:
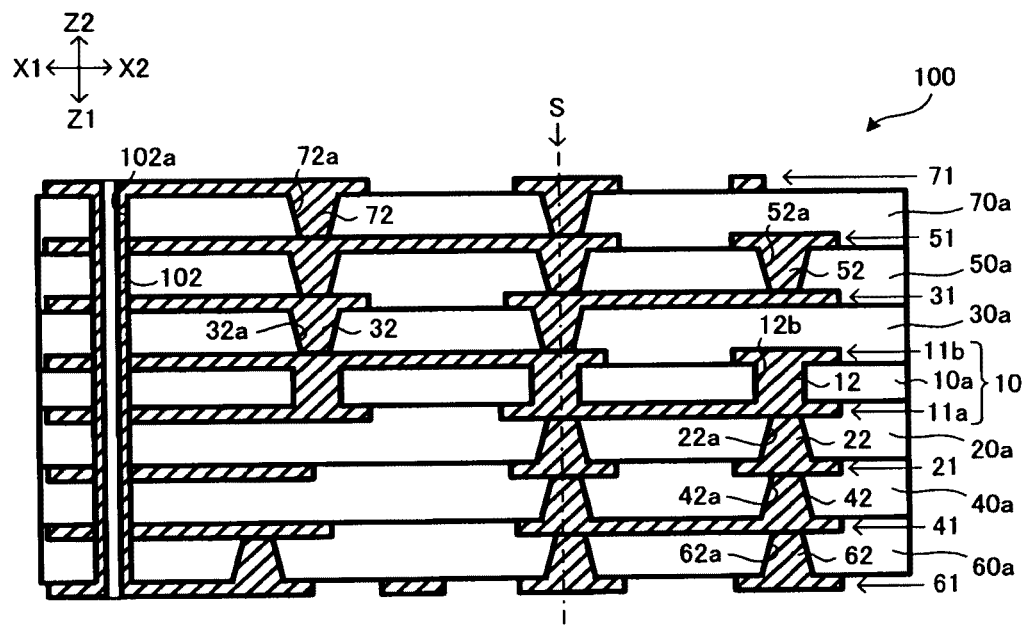
FIG. 32 is a view showing an example in which filled conductors in the core substrate are through-hole conductors.

Filled conductors 12 are not limited to being via conductors. For example, as shown in FIG. 32, filled conductors 12 may be through-hole conductors. In the example in FIG. 32, filled conductors 12 are formed by filling plating in through holes (12b). Namely, filled conductors 12 and conductive layers (11a, 11b) on both sides of insulation layer (10a) are at least partly contiguous.

Figure 33:
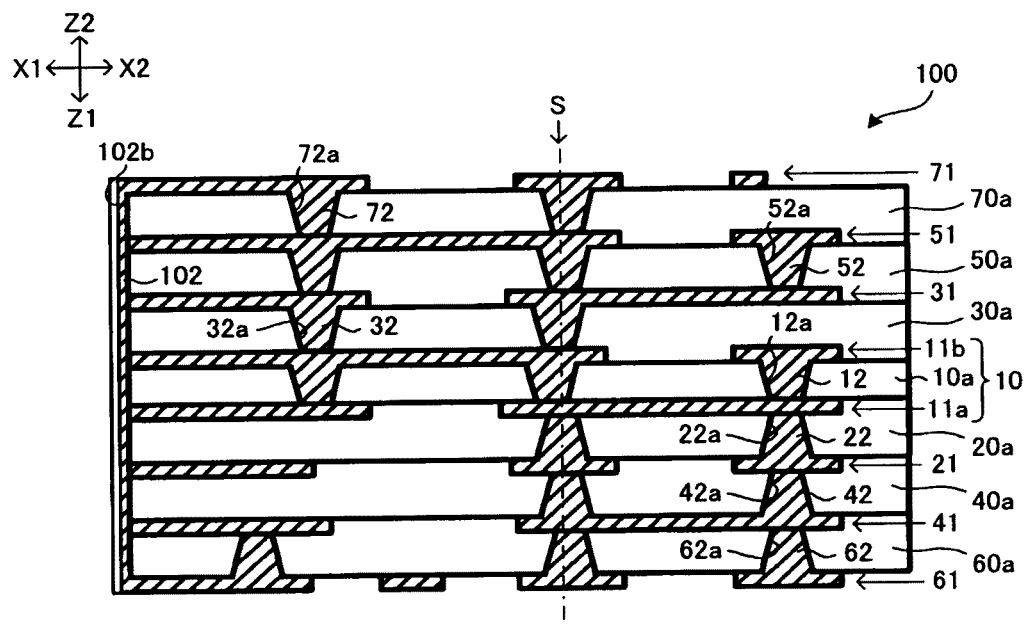
FIG. 33 is a cross-sectional view showing an example in which notches are used instead of through holes.
Figure 34:
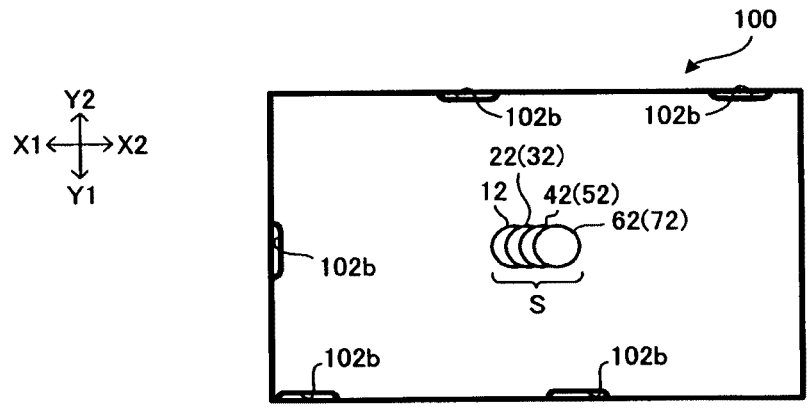
FIG. 34 is a plan view showing an example in which notches are used instead of through holes.
Figure 35:
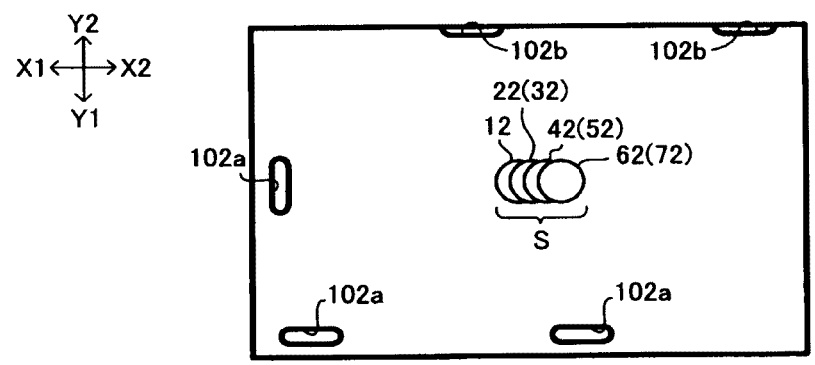
FIG. 35 is a view showing an example in which through holes and notches are both used.
Figure 36:
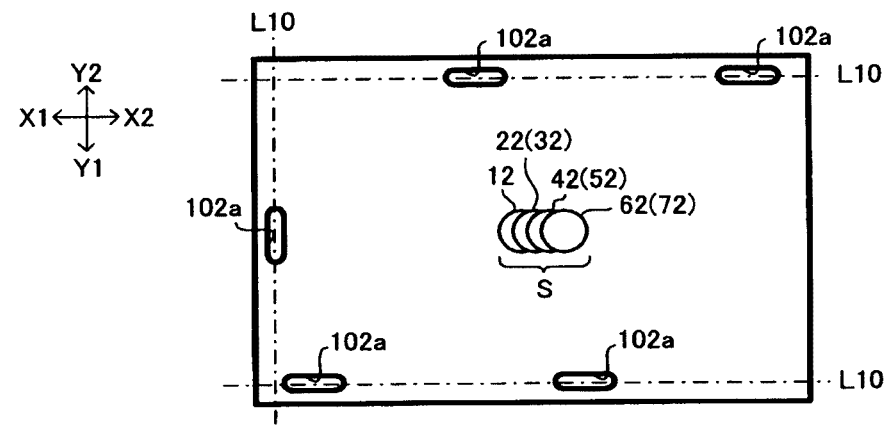
FIG. 36 is a view showing an example of how to form notches.

As shown in FIG. 33 and FIG. 34 (a cross-sectional view of FIG. 33), instead of through holes (102a), notches (102b) which penetrate through wiring board 100 in directions Z (lamination directions) may be used. Notches (102b) are formed on side surfaces of wiring board 100. On the wall surfaces of notches (102b), conformal conductors 102 are formed. Alternatively, as shown in FIG. 35, through holes (102a) and notches (102b) may both be used. As shown in FIG. 36, notches (102b) may be formed by dividing (slicing) through holes (102a) with line (L10) after through holes (102a) are formed. However, a method for forming notches (102b) is not limited specifically.

Figure 37A:
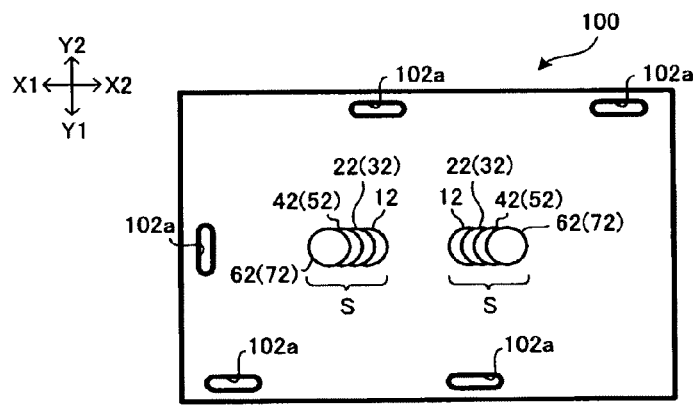
FIG. 37A is a view showing an example of a wiring board having two filled-stack structures which are shifted in opposite directions.
Figure 37B:
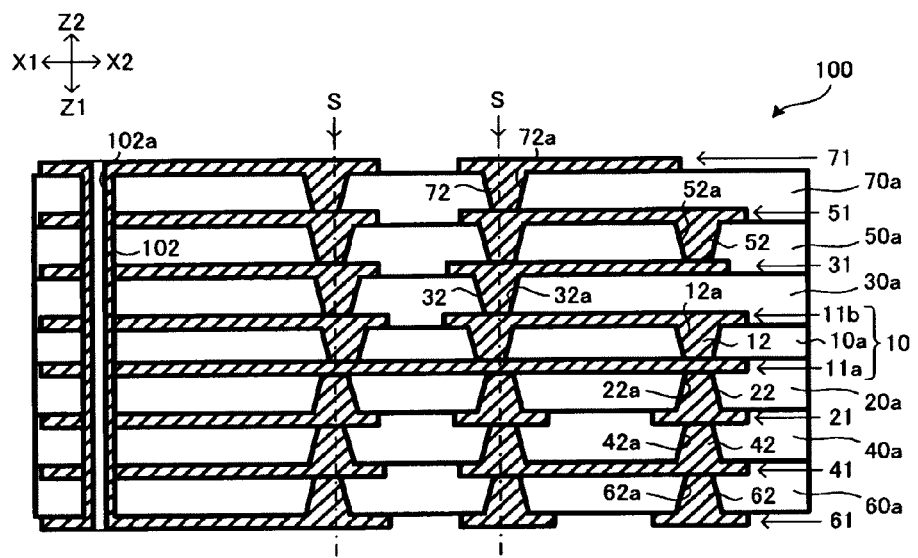
FIG. 37B is a cross-sectional view of FIG. 37A.

The number of filled-stack structures "S" is not limited to one. For example, as shown in FIG. 37A and FIG. 37B (a cross-sectional view of FIG. 37A), wiring board 100 may contain two filled-stack structures "S," which are shifted in opposite directions.

Wiring board 100 may contain electronic components and be set as an electronic device.

Figure 38:
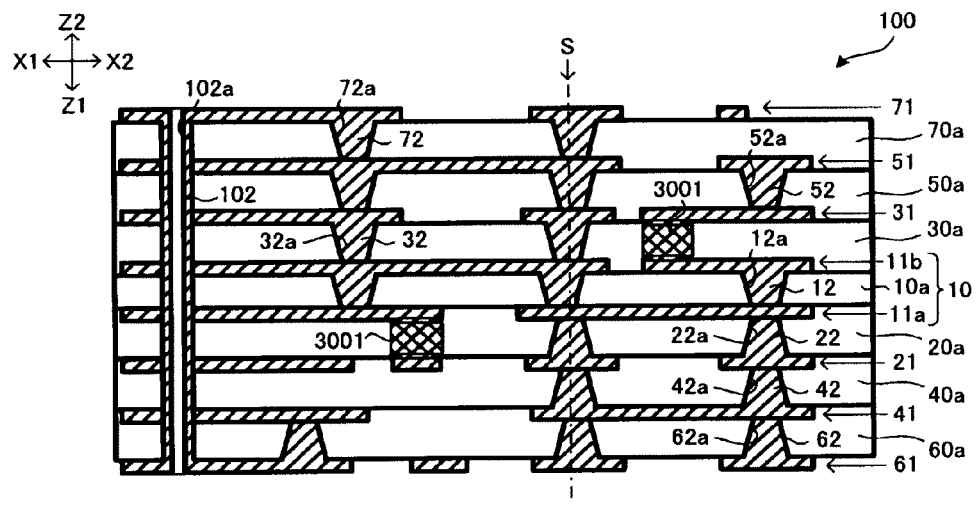
FIG. 38 is a view showing an example of a wiring board with built-in electronic components.

For example, as shown in FIG. 38, electronic components 3001 may be built into wiring board 100. In the example shown in FIG. 38, two electronic components 3001 are built into the wiring board. However, the number of electronic components is not limited specifically. For example, it is an option to build only one electronic component into wiring board 100. Using wiring board 100 with built-in electronic components, highly functional electronic devices are obtained.

Figure 39:
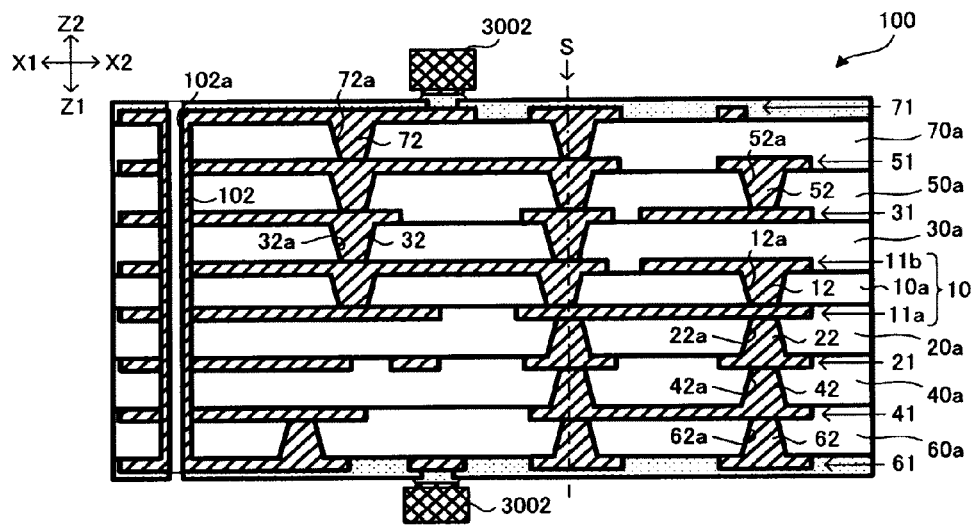
FIG. 39 is a view showing an example of a wiring board with electronic components mounted on its surfaces.

In addition, as shown in FIG. 39, electronic components 3002 may be mounted on surfaces of wiring board 100. In the example shown in FIG. 39, electronic components 3002 are mounted on both surfaces of wiring board 100. However, electronic component 3002 could be mounted only on one surface. Also, the number of electronic components may be determined freely. For example, it is an option to mount only one electronic component on wiring board 100.

Regarding other factors, the structure of wiring board 100, as well as type, performance, size, quality, shape, number of layers, positioning and so forth of the elements of such a structure, may be modified freely within a scope that does not deviate from the gist of the present invention.

Figure 40:
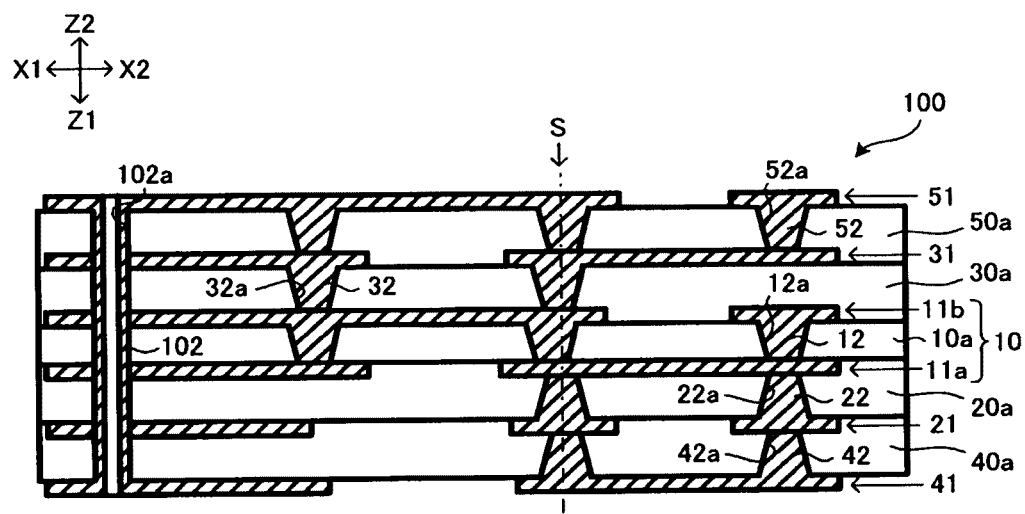
FIG. 40 is a view showing an example of a six-layer wiring board.

The number of layers in wiring board 100 may be determined freely. For example, as shown in FIG. 40, even if wiring board 100 has fewer than eight layers and is structured to be six-layered, as long as at least filled conductors (42, 52) (outer-layer connection conductors) are positioned by being shifted from filled conductor 12 (connection conductor in core substrate 10) in substantially the same direction (such as toward X2) on both sides of core substrate 10, it is thought that effects such as suppressing cracks from occurring near the core are expected as described above. Conversely, for example, to achieve high functionality, a multilayer wiring board with more than eight layers may be formed by further continuing lamination after the structure shown in FIG. 1 is completed.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than the above-mentioned epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluororesin) may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each conductive layer and each insulation layer may be formed with multiple layers having different materials.

The order and contents of the steps in the above embodiment are not limited to those shown in the flowchart in FIG. 10. The order and contents may be modified within a scope that does not deviate from the gist of the present invention. Also, some steps may be omitted according to usage requirements or the like.

The above embodiment and modified examples or the like may be combined freely.

A wiring board according to one aspect of the present invention has two or more conductive layers and two or more insulation layers alternately laminated on both sides of a core substrate. In such a wiring board, the core substrate and the laminated insulation layers have connection conductors each formed by filling plating in holes, the connection conductor in the core substrate and the connection conductors in the laminated insulation layers are stacked, and the position of the outer-layer connection conductor on one side of the laminated insulation layers and the position of the outer-layer connection conductor on the other side are shifted in substantially the same direction from the position of the connection conductor in the core substrate.

A method for manufacturing a wiring board according to another aspect of the present invention includes the following: preparing a core substrate having a connection conductor made by filling plating in a hole; forming insulation layers on both sides of the core substrate; forming holes in the insulation layers on both sides of the core substrate; on both sides of the core substrate, forming connection conductors by filling plating in the holes in the insulation layers; and on both sides of the core substrate, forming conductive layers on the insulation layers. In such a method, by repeatedly forming the insulation layers, forming the connection conductors and forming the conductive layers, two or more layers of the conductive layers and two or more layers of the insulation layers are alternately laminated on both sides of the core substrate, and the connection conductor in the core substrate and the connection conductors in the laminated insulation layers are stacked, while the position of the outer-layer connection conductor on one side of the laminated insulation layer and the position of the outer-layer connection conductor on the other side are shifted in substantially the same direction from the position of the connection conductor in the core substrate.

Preparing includes situations in which material and components are purchased and manufactured accordingly as well as situations in which finished products are purchased and used accordingly.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a core substrate having a first surface and a second surface on an opposite side of the first surface;
a first laminated structure formed on the first surface of the core substrate and comprising a plurality of conductive layers and a plurality of insulation layers; and
a second laminated structure formed on the second surface of the core substrate and comprising a plurality of conductive layers and a plurality of insulation layers,
wherein the core substrate has a hole and a connection conductor comprising a plating filling the hole, the plurality of insulation layers of the first laminated structure has a plurality of holes and a plurality of connection conductors, the connection conductors of the first laminated structure are stacked one over another and comprise platings filling the holes in the first laminated structure, respectively, the plurality of insulation layers of the second laminated structure has a plurality of holes and a plurality of connection conductors, the connection conductors of the second laminated structure are stacked one over another and comprise platings filling the holes in the second laminated structure, respectively, the connection conductors of the first and second laminated structures are stacked on the connection conductor of the core substrate, the plurality of connection conductors of the first laminated structure includes an outer-layer connection conductor formed in an outer insulation layer of the insulation layers of the first laminated structure, the plurality of connection conductors of the second laminated structure includes an outer-layer connection conductor formed in an outer insulation layer of the insulation layers of the second laminated structure, and the outer-layer connection conductors of the first and second laminated structures have positions which are shifted in a substantially same direction from a position of the connection conductor of the core substrate.

2. The wiring board according to claim 1, wherein the connection conductors of the first and second laminated structures are shifted from the connection conductor of the core substrate in the substantially same direction.

3. The wiring board according to claim 2, wherein the connection conductors of the first and second laminated structures have positions shifted in a substantially constant direction from the core substrate.

4. The wiring board according to claim 3, wherein the positions of the connection conductors of the first and second laminated structures are shifted at shifting angles which are substantially constant along the substantially constant direction.

5. The wiring board according to claim 3, wherein the positions of the connection conductors of the first and second laminated structures are shifted at a same shifting angle along the substantially constant direction.

6. The wiring board according to claim 3, wherein the positions of the connection conductors of the first and second laminated structures are shifted with shifting amounts which are substantially constant along the substantially constant direction.

7. The wiring board according to claim 3, wherein the positions of the connection conductors of the first and second laminated structures are shifted with a same shifting amount along the substantially constant direction.

8. The wiring board according to claim 1, wherein the connection conductors of the first and second laminated structures have positions shifted in a substantially constant direction from the core substrate.

9. The wiring board according to claim 3, wherein the positions of the connection conductors of the first and second laminated structures are shifted with shifting amounts which are in an approximate range of 1~25 μm.

10. The wiring board according to claim 1, wherein the core substrate, the first laminated structure and the second laminated structure has a through hole penetrating through the core substrate, the first laminated structure and the second laminated structure, and the through hole has a plating formed on a wall surface of the through hole.

11. The wiring board according to claim 10, wherein the through hole has an elliptical opening shape.

12. The wiring board according to claim 1, wherein the core substrate, the first laminated structure and the second laminated structure has a notch formed through the core substrate, the first laminated structure and the second laminated structure, and the notch has a plating formed on a wall surface of the notch.

13. The wiring board according to claim 12, wherein the notch has an elliptical opening shape.

14. The wiring board according to claim 1, wherein each of the insulation layers of the first laminated structure and the second laminated structure comprises a core material impregnated with a resin.

15. The wiring board according to claim 1, wherein the plurality of conductive layers of the first laminated structure comprises three or more conductive layers, the plurality of conductive layers of the second laminated structure comprises three or more conductive layers, the plurality of insulation layers of the first laminated structure comprises three or more insulation layers, the plurality of insulation layers of the second laminated structure comprises three or more insulation layers, the conductive layers and insulation layers of the first laminated structure are alternately laminated, and the conductive layers and insulation layers of the second laminated structure are alternately laminated.

16. A method for manufacturing a wiring board, comprising:
preparing a core substrate having a hole and a connection conductor comprising a plating filling the hole;
forming a plurality of insulation layers on a first surface of the core substrate and a second surface of the core substrate, respectively;
forming a plurality of holes in the plurality of insulation layers, respectively;
filling platings in the holes in the insulation layers such that a plurality of connection conductors are formed; and
forming a plurality of conductive layers on the plurality of insulation layers, respectively,
wherein the forming of the insulation layers, the filling of the platings and the forming of the conductive layers are carried out in repetition such that a first laminated structure comprising a plurality of conductive layers, a plurality of insulation layers and a plurality of connection conductors is formed on the first surface of the core substrate, that a second laminated structure comprising a plurality of conductive layers, a plurality of insulation layers and a plurality of connection conductors is formed on the second surface of the core substrate, that the connection conductors of the first and second laminated structures are stacked on the connection conductor of the core substrate, that the plurality of connection conductors of the first laminated structure includes an outer-layer connection conductor formed in an outer insulation layer of the insulation layers of the first laminated structure, that the plurality of connection conductors of the second laminated structure includes an outer-layer connection conductor formed in an outer insulation layer of the insulation layers of the second laminated structure, and that the outer-layer connection conductors of the first and second laminated structures have positions which are shifted in a substantially same direction from a position of the connection conductor of the core substrate.

17. The method for manufacturing a wiring board according to claim 16, wherein the repetition comprises forming the connection conductors of the first and second laminated structures such that the connection conductors of the first and second laminated structures are shifted from the connection conductor of the core substrate in the substantially same direction.

18. The method for manufacturing a wiring board according to claim 17, wherein the repetition comprises forming the connection conductors of the first and second laminated structures such that the connection conductors of the first and second laminated structures have positions shifted in a substantially constant direction from the core substrate.

19. The method for manufacturing a wiring board according to claim 16, wherein the repetition comprises forming the plurality of conductive layers of the first laminated structure which comprises three or more conductive layers and forming the plurality of insulation layers of the first laminated structure which comprises three or more insulation layers such that the conductive layers and insulation layers of the first laminated structure are alternately laminated and forming the plurality of conductive layers of the second laminated structure which comprises three or more conductive layers and forming the plurality of insulation layers of the second laminated structure which comprises three or more insulation layers such that the conductive layers and insulation layers of the second laminated structure are alternately laminated.

20. The method for manufacturing a wiring board according to claim 16, further comprising:
forming a through hole penetrating through the core substrate, the first laminated structure and the second laminated structure; and
forming a plating on a wall surface of the through hole.

21. The method for manufacturing a wiring board according to claim 20, wherein the forming of the plating on the wall surface of the through hole and the filling the hole in the insulation layers of the first and second laminated structures at outermost position are simultaneously conducted.

22. The method for manufacturing a wiring board according to claim 16, further comprising:
forming a notch formed through the core substrate, the first laminated structure and the second laminated structure; and
forming a plating on a wall surface of the notch.

* * * * *